(12) United States Patent
Koyama et al.

(10) Patent No.: US 8,629,823 B2
(45) Date of Patent: *Jan. 14, 2014

(54) DRIVING CIRCUIT OF A SEMICONDUCTOR DISPLAY DEVICE AND THE SEMICONDUCTOR DISPLAY DEVICE

(71) Applicant: Semiconductor Energy Laboratory Co., Ltd., Atsugi (JP)

(72) Inventors: Jun Koyama, Sagamihara (JP); Shunpei Yamazaki, Setagaya (JP)

(73) Assignee: Semiconductor Energy Laboratory Co., Ltd., Atsugi-shi, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/763,895

(22) Filed: Feb. 11, 2013

(65) Prior Publication Data

US 2013/0147691 A1 Jun. 13, 2013

Related U.S. Application Data

(60) Continuation of application No. 13/289,488, filed on Nov. 4, 2011, now Pat. No. 8,373,631, which is a continuation of application No. 12/003,698, filed on Dec. 31, 2007, now Pat. No. 8,054,270, which is a continuation of application No. 10/827,438, filed on Apr. 20, 2004, now Pat. No. 7,315,296, which is a division of application No. 10/341,470, filed on Jan. 14, 2003, now Pat. No. 7,304,625, which is a division of application No. 09/275,426, filed on Mar. 24, 1999, now Pat. No. 6,549,184.

(30) Foreign Application Priority Data

Mar. 27, 1998 (JP) .................................... 10-100638

(51) Int. Cl.
  *G09G 3/36* (2006.01)

(52) U.S. Cl.
  USPC ............................................. 345/92; 345/98

(58) Field of Classification Search
  USPC ...................... 345/30–111; 315/169.1–169.4; 341/133–136
  See application file for complete search history.

(56) References Cited

U.S. PATENT DOCUMENTS 4,178,605 A 12/1979 Hsu et al.
4,330,363 A 5/1982 Biegesen et al.
(Continued)

FOREIGN PATENT DOCUMENTS

DE 195 40 146 5/1996
EP 0 091 806 10/1983
(Continued)

OTHER PUBLICATIONS

U.S. Appl. No. 09/334,646, including specification, drawings, and pending claims, "Semiconductor Device and Fabrication Method Thereof," Shunpei Yamazaki, et al., filed Jun. 17, 1999.

(Continued)

*Primary Examiner* — Srilakshimi K Kumar
(74) *Attorney, Agent, or Firm* — Eric J. Robinson; Robinson Intellectual Property Law Office, P.C.

(57) ABSTRACT

There are provided a driving circuit of a semiconductor display device which can obtain an excellent picture without picture blur (display unevenness) and with high fineness/high resolution, and the semiconductor display device. A buffer circuit used in the driving circuit of the semiconductor display device is constituted by a plurality of TFTs each having a small channel width, and a plurality of such buffer circuits are connected in parallel with each other.

20 Claims, 18 Drawing Sheets

(56) References Cited

U.S. PATENT DOCUMENTS

| | | |
|---|---|---|
| 4,466,179 A | 8/1984 | Kasten |
| 4,582,395 A | 4/1986 | Morozumi |
| 4,797,629 A | 1/1989 | Widlar |
| 4,877,980 A | 10/1989 | Kubinec |
| 4,999,529 A | 3/1991 | Morgan, Jr. et al. |
| 5,034,792 A | 7/1991 | Kimura et al. |
| 5,051,739 A | 9/1991 | Hayashida et al. |
| 5,145,808 A | 9/1992 | Sameshima et al. |
| 5,166,671 A | 11/1992 | Maekawa |
| 5,194,853 A | 3/1993 | Asada |
| 5,227,679 A | 7/1993 | Woo |
| 5,247,375 A | 9/1993 | Mochizuki et al. |
| 5,250,852 A | 10/1993 | Ovens et al. |
| 5,250,931 A | 10/1993 | Misawa et al. |
| 5,256,916 A | 10/1993 | Thurston |
| 5,264,383 A | 11/1993 | Young |
| 5,274,279 A | 12/1993 | Misawa et al. |
| 5,335,023 A | 8/1994 | Edwards |
| 5,341,012 A | 8/1994 | Misawa et al. |
| 5,357,290 A | 10/1994 | Horibe |
| 5,365,875 A | 11/1994 | Asai et al. |
| 5,372,836 A | 12/1994 | Imahashi et al. |
| 5,403,762 A | 4/1995 | Takemura |
| 5,413,958 A | 5/1995 | Imahashi et al. |
| 5,432,122 A | 7/1995 | Chae |
| 5,432,527 A | 7/1995 | Yanai et al. |
| 5,471,225 A | 11/1995 | Parks |
| 5,477,073 A | 12/1995 | Wakai et al. |
| 5,529,630 A | 6/1996 | Imahashi et al. |
| 5,566,080 A | 10/1996 | Yokoi |
| 5,583,347 A | 12/1996 | Misawa et al. |
| 5,589,406 A | 12/1996 | Kato et al. |
| 5,591,990 A | 1/1997 | Misawa et al. |
| 5,594,569 A | 1/1997 | Konuma et al. |
| 5,597,740 A | 1/1997 | Ito et al. |
| 5,598,106 A | 1/1997 | Kawasaki et al. |
| 5,610,414 A | 3/1997 | Yoneda et al. |
| 5,616,935 A | 4/1997 | Koyama et al. |
| 5,616,936 A | 4/1997 | Misawa et al. |
| 5,627,557 A | 5/1997 | Yamaguchi et al. |
| 5,643,826 A | 7/1997 | Ohtani et al. |
| 5,648,277 A | 7/1997 | Zhang et al. |
| 5,648,685 A | 7/1997 | Misawa et al. |
| 5,656,826 A | 8/1997 | Misawa et al. |
| 5,677,212 A | 10/1997 | Misawa et al. |
| 5,680,149 A | 10/1997 | Koyama et al. |
| 5,714,771 A | 2/1998 | Misawa et al. |
| 5,731,613 A | 3/1998 | Yamazaki et al. |
| 5,734,366 A | 3/1998 | Kubota et al. |
| 5,748,165 A | 5/1998 | Kubota et al. |
| 5,754,158 A | 5/1998 | Misawa et al. |
| 5,764,206 A | 6/1998 | Koyama et al. |
| 5,767,529 A | 6/1998 | Kobori et al. |
| 5,780,872 A | 7/1998 | Misawa et al. |
| 5,798,742 A | 8/1998 | Watatani et al. |
| 5,801,672 A | 9/1998 | Masuda et al. |
| 5,808,595 A | 9/1998 | Kubota et al. |
| 5,811,837 A | 9/1998 | Misawa et al. |
| 5,844,535 A | 12/1998 | Itoh et al. |
| 5,883,609 A | 3/1999 | Asada et al. |
| 5,900,854 A | 5/1999 | Itoh et al. |
| 5,904,511 A | 5/1999 | Misawa et al. |
| 5,923,962 A | 7/1999 | Ohtani et al. |
| 5,942,856 A | 8/1999 | Koyama |
| 5,945,970 A | 8/1999 | Moon et al. |
| 5,956,581 A | 9/1999 | Yamazaki et al. |
| 5,959,313 A | 9/1999 | Yamazaki et al. |
| 5,982,348 A | 11/1999 | Nakajima et al. |
| 5,990,877 A | 11/1999 | Yeo |
| 6,028,580 A | 2/2000 | Kosegawa et al. |
| 6,037,923 A | 3/2000 | Suzuki |
| 6,054,976 A | 4/2000 | Kubota et al. |
| 6,057,183 A | 5/2000 | Koyama et al. |
| 6,069,605 A | 5/2000 | Ozawa |
| 6,084,248 A | 7/2000 | Inoue |
| 6,107,983 A | 8/2000 | Masuda et al. |
| 6,108,056 A | 8/2000 | Nakajima et al. |
| 6,225,866 B1 | 5/2001 | Kubota et al. |
| 6,246,387 B1 | 6/2001 | Yamazaki |
| 6,268,842 B1 | 7/2001 | Yamazaki et al. |
| 6,333,520 B1 | 12/2001 | Inoue |
| 6,486,497 B2 | 11/2002 | Misawa et al. |
| 6,496,171 B2 | 12/2002 | Yamazaki |
| 6,538,632 B1 | 3/2003 | Yamazaki et al. |
| 6,549,184 B1 | 4/2003 | Koyama et al. |
| 6,677,609 B2 | 1/2004 | Inoue |
| 6,700,135 B2 | 3/2004 | Misawa et al. |
| 6,831,299 B2 | 12/2004 | Koyama |
| 7,027,022 B2 | 4/2006 | Koyama et al. |
| 7,195,960 B2 | 3/2007 | Inoue |
| 7,304,625 B2 | 12/2007 | Koyama et al. |
| 7,315,296 B2 | 1/2008 | Koyama et al. |
| 7,550,765 B2 | 6/2009 | Yamazaki et al. |
| 7,557,377 B2 | 7/2009 | Yamazaki et al. |
| 8,054,270 B2 | 11/2011 | Koyama et al. |

FOREIGN PATENT DOCUMENTS

| | | |
|---|---|---|
| EP | 0 269 744 A | 6/1988 |
| EP | 0 550 216 | 7/1993 |
| EP | 0 657 863 | 6/1995 |
| EP | 0 674 207 A | 9/1995 |
| EP | 0 806 701 | 11/1997 |
| JP | 57-132191 A | 8/1982 |
| JP | 58-127318 | 7/1983 |
| JP | 59-161014 | 9/1984 |
| JP | 62-268161 | 11/1987 |
| JP | 62-271569 A | 11/1987 |
| JP | 62-271574 A | 11/1987 |
| JP | 02-079091 A | 3/1990 |
| JP | 03-141391 | 6/1991 |
| JP | 04-282869 | 10/1992 |
| JP | 05-001893 | 1/1993 |
| JP | 05-175235 | 7/1993 |
| JP | 05-203977 | 8/1993 |
| JP | 05-303080 | 11/1993 |
| JP | 06-053813 | 2/1994 |
| JP | 06-123896 | 5/1994 |
| JP | 07-094744 | 4/1995 |
| JP | 07-130652 | 5/1995 |
| JP | 07-135318 | 5/1995 |
| JP | 07-147411 | 6/1995 |
| JP | 07-162788 | 6/1995 |
| JP | 07-181927 A | 7/1995 |
| JP | 07-327185 | 12/1995 |
| JP | 8-062637 | 3/1996 |
| JP | 08-064834 | 3/1996 |
| JP | 08-078329 | 3/1996 |
| JP | 08-083849 A | 3/1996 |
| JP | 08-146918 | 6/1996 |
| JP | 08-172049 | 7/1996 |
| JP | 09-008314 | 1/1997 |
| JP | 09-036730 | 2/1997 |
| JP | 09-074204 | 3/1997 |
| JP | 09-097909 | 4/1997 |
| JP | 09-330059 A | 12/1997 |
| JP | 10-079515 | 3/1998 |
| JP | 2004-363625 | 12/2004 |
| JP | 4198477 | 12/2008 |
| WO | WO 95/07493 | 3/1995 |
| WO | WO 98/00870 | 1/1998 |

OTHER PUBLICATIONS

Furue et al., "P-78: Characteristics and Driving Scheme of Polymer-Stabilized Monostable FLCD Exhibiting Fast Response Time and High Contrast Ratio with Gray-Scale Capability," pp. 782-785, 1998, SID 98 Digest.

Yoneda et al., "A Smart Arrangement of TFTs in Low-Temperature Poly-Silicon Circuitry for Achieving Higher Effective Yield in Production," pp. L1-L4, 1997, SID.

Ohtani et al., "Late-News Poster: A 60 in. HDTV Rear Projector with Continuous-Grain-Silicon Technology," Society for Information Display International Symposium-Digest of Technical Papers, vol. XXIX, May 1998, pp. 467-470.

(56) References Cited

OTHER PUBLICATIONS

Yoshida et al., "33.2: A Full-Color Thresholdless Antiferroelectric LCD Exhibiting Wide Viewing Angle with Fast Response Time," pp. 841-844, 1997, SID 97 Digest.

Translation of JP 5-175235, Jun. 1993.

Translation of JP 5-203977, Aug. 1993.

M. Bonnel et al., IEEE Electron Dev. Lett., 14(12)(1993)551, "TFTs with two step annealing process," Dec. 1993.

I. Fujieda et al., IEMD '93 Proc., p. 587, "Self-referenced Polys-Si TFT amplifier," 1993.

Webster's II New Riverside University Dictionary, Houghton-Mifflin Company, 1994.

Official Action dated Apr. 21, 2005 for U.S. Appl. No. 10/341,470, filed Jan. 14, 2003 to Koyama et al., and Pending Claims.

Non-final Official Action in U.S. Appl. No. 10/341,470, mailed May 17, 2004.

Office Action (Application No. 19913920.2) dated May 8, 2008.

Office Action (Application No. 199645361) dated Apr. 1, 2010.

M. Fuse, et al., "Performance of Poly-Si Thin Film Transistors Fabricated by Excimer Laser Annealing of SlH4- and Sl2H6-Source Low Pressure Vapor Deposited A-Si Films With or Without Solid-Phase Crystallization" Solid State Phenomena vol. 37-38 pp. 565-570, 1994.

DRIVING CIRCUIT OF A SEMICONDUCTOR DISPLAY DEVICE AND THE SEMICONDUCTOR DISPLAY DEVICE

BACKGROUND OF THE INVENTION

1. Field of the Invention

The present invention relates to a driving circuit of an active matrix type semiconductor display device. The present invention also relates to the semiconductor display device having the driving circuit.

2. Description of the Related Art

In recent years, a technique for manufacturing a semiconductor device having a semiconductor thin film formed on an inexpensive glass substrate, such as a thin film transistor (TFT), has been rapidly developed. The reason is that the demand for an active matrix type semiconductor display device (especially an active matrix type liquid crystal display device) has been increased.

In the active matrix type liquid crystal display device, a TFT is disposed for each of several tens to millions of pixels arranged in matrix, and an electrical charge going in and out each pixel electrode is controlled by a switching function of the TFT.

Especially, with the improvement of a display device in resolution and picture quality, attention comes to be paid to an active matrix type liquid crystal display device having a digital driving circuit which can process digital video data as it is.

In a source signal line side driving circuit of a semiconductor display device including a digital driving circuit, digital video data supplied from the outside are sequentially held by a latch circuit or the like for a short time on the basis of a timing signal from a shift register. And after the data are converted into an analog signal (gradation voltage), the signal is supplied to a corresponding pixel TFT. When the digital driving circuit is used, it becomes possible to realize a so-called line-sequential driving in which pixel TFTs for one line are driven at the same time.

In the digital driving circuit, on the basis of the timing signal from the shift register, operation timing of the latch circuit, D/A conversion circuit, and the like is determined. A number of circuits and elements each having a large load capacity are connected to a signal line to which the timing signal is supplied from the shift register. Thus, there is a case that the timing signal from the shift register produces "dulling" on the way. As one of countermeasures to this, a trial has been made in which the timing signal from the shift register is made to pass through a buffer circuit or the like to eliminate "dulling".

If current capacity of a buffer circuit is small, the buffer function is meaningless. So, a buffer having a large current capacity to a certain degree is required. In the case where a buffer having a large current capacity is formed using thin film transistors, a TFT having a large current capacity, that is, a large channel width is required. However, in a TFT having a large channel width, fluctuation in crystallinity occurs in a component, and as a result, fluctuation in threshold voltage occurs for each TFT. Thus, it is inevitable that fluctuation occurs also in the characteristics of a buffer constituted by a plurality of TFTs. Thus, there exist buffers having fluctuation in the characteristics for each signal line, and the fluctuation in the characteristics directly causes fluctuation in applied voltage to a pixel matrix circuit. This causes display blur (display unevenness) of the display device as a whole.

Moreover, if the size (channel width) of a TFT is too large, only the center portion of the TFT functions as a channel, and its ends do not function as the channel. In this case, deterioration of the TFT is accelerated.

Further, when the size of a TFT is large, self heat generation of the TFT becomes large, which sometimes causes change of a threshold value or deterioration.

In a gate signal line side driving circuit as well, a scanning signal is sequentially supplied to a gate signal line (scanning line) on the basis of a timing signal from a shift register. In a digital driving circuit carrying out line-sequential driving, all pixel TFTs for one line connected to one scanning line must be driven, and a load capacity connected to one scanning line is large. Thus, also in the gate signal line side driving circuit, it is necessary to eliminate "dulling" by making the timing signal from the shift register pass through a buffer circuit or the like. Also in this case, since a buffer having a large current capacity becomes necessary, the above described problems come to occur. Especially, the buffer of the gate signal line must drive all of the connected TFTs for one line in the pixel matrix circuit, so that the fluctuation in the characteristics of the buffer makes remarkable picture unevenness. This is one of the most serious problems when a display device with high fineness/high resolution is desired.

SUMMARY OF THE INVENTION

The present invention has been made to overcome the foregoing problems, and an object thereof is to provide a semiconductor display device which can eliminate picture blur (display unevenness) and can obtain an excellent picture with high fineness/high resolution.

According to a mode of carrying out the present invention, in a driving circuit of a semiconductor display device, as a TFT constituting a buffer circuit provided between a shift register circuit and a latch circuit of a source signal line side driving circuit, a TFT having a large size (channel width) is not used, but instead thereof, a plurality of TFTs each having a small size and are connected in parallel with each other are used. Moreover, as a TFT constituting a buffer circuit provided between a shift register circuit and a gate signal line of a gate signal line side driving circuit, a TFT having a large size (channel width) is not used, but instead thereof, a plurality of TFTs each having a small size and are connected in parallel with each other are used. In both cases, a plurality of buffer circuits are connected in parallel with each other to constitute a buffer circuit portion in a driver circuit. By doing so, it is possible to reduce fluctuation in characteristics of the buffer circuit while securing the current capacity thereof.

The structure of the present invention will be described hereinafter.

According to one aspect of the present invention, there is provided a driving circuit of a semiconductor display device, comprising: a source signal line side driving circuit; and a gate signal line side driving circuit, wherein the gate signal line side driving circuit includes a buffer circuit which buffers a timing signal from a shift register circuit and includes a plurality of inverter circuits, and each of the inverter circuits is constituted by a plurality of inverters connected in parallel with each other. By this, the above object can be achieved.

According to another aspect of the present invention, there is provided a driving circuit of a semiconductor display device, comprising: a source signal line side driving circuit; and a gate signal line side driving circuit, wherein the source signal line side driving circuit includes a buffer circuit which buffers a timing signal from a shift register circuit and includes a plurality of inverter circuits, and each of the inverter circuits is constituted by a plurality of inverters connected in parallel with each other. By this, the above object can be achieved.

According to still another aspect of the present invention, there is provided a driving circuit of a semiconductor display device, comprising: a source signal line side driving circuit; and a gate signal line side driving circuit, wherein the source signal line side driving circuit includes a buffer circuit which buffers a timing signal from a shift register circuit and includes a plurality of inverter circuits, and each of the inverter circuits is constituted by a plurality of inverters connected in parallel with each other, and wherein the gate signal line side driving circuit includes a buffer circuit which buffers a timing signal from a shift register circuit and includes a plurality of inverter circuits, and each of the inverter circuits is constituted by a plurality of inverters connected in parallel with each other. By this, the above object can be achieved.

According to still another aspect of the present invention, there is provided a semiconductor display device, comprising: the driving circuit of the semiconductor display device according to each of the foregoing aspects of the present invention; and a pixel matrix circuit. By this, the above object can be achieved.

DETAILED DESCRIPTION OF THE PREFERRED EMBODIMENTS

A driving circuit of a semiconductor display device and the semiconductor display device according to the present invention will be described below in detail in accordance with the following embodiments. However, the following embodiments are merely some embodiments of the present invention, and the driving circuit of the semiconductor display device and the semiconductor device according to the present invention are not limited thereto.

[Embodiment 1]

In this embodiment, as an example in which a driving circuit of a semiconductor display device of the present invention is used, an active matrix type liquid crystal display device in which the number of pixels is 1920×1080 in horizontal and vertical will be described.

Figure 1:
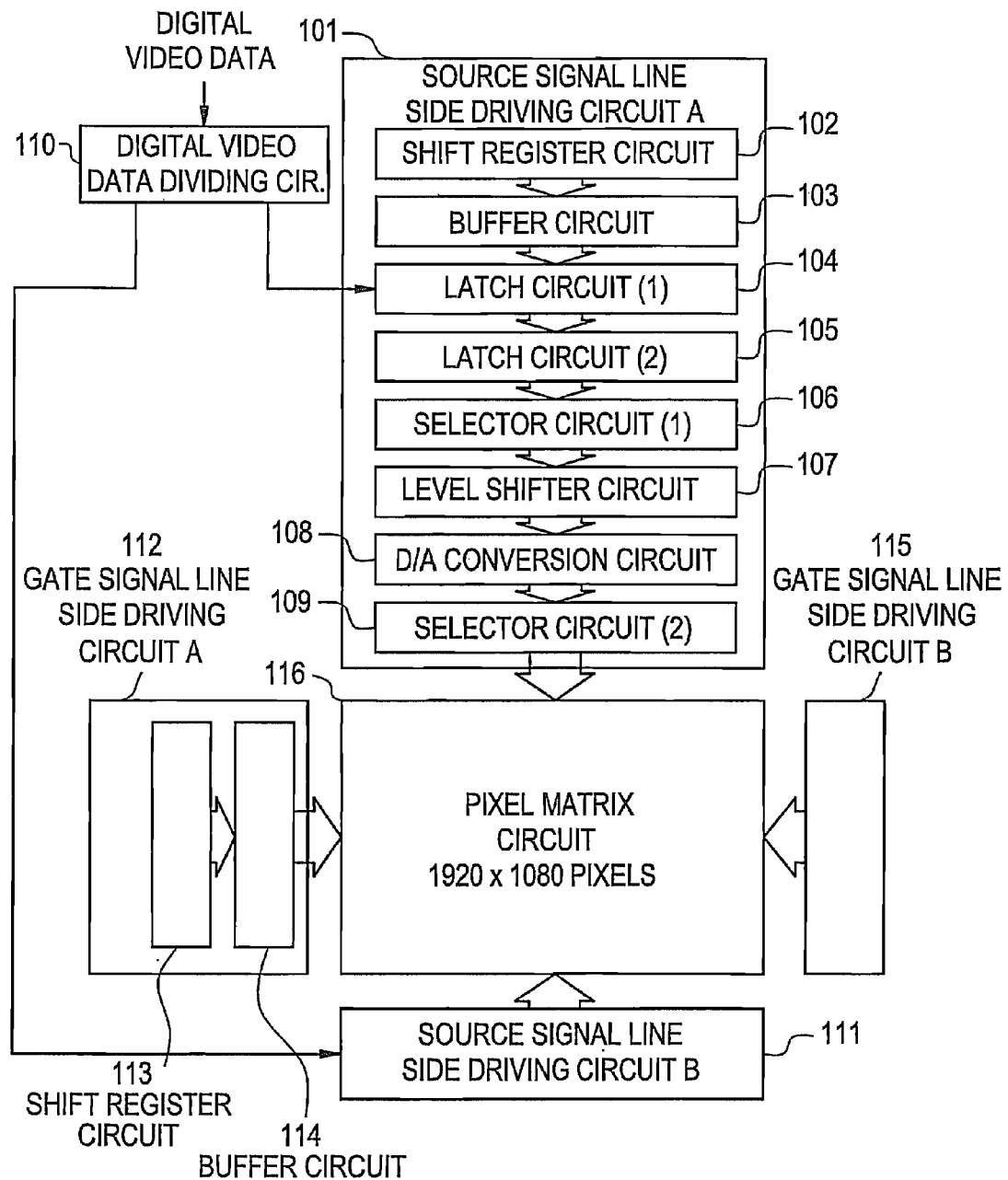
FIG. 1 is a circuit block diagram of an active matrix type liquid crystal display device including driving circuits according to an embodiment of the present invention.

Reference will be made to FIG. 1. FIG. 1 is a block diagram of a main portion of an active matrix type liquid crystal display device of this embodiment. The active matrix type liquid crystal display device of this embodiment includes a source signal line side driving circuit A 101, a source signal line side driving circuit B 111, a gate signal line side driving circuit A 112, a gate signal line side driving circuit B 115, a pixel matrix circuit 116, and a digital video data dividing circuit 110.

The source signal line side driving circuit A 101 includes a shift register circuit 102, a buffer circuit 103, a latch circuit (1) 104, a latch circuit (2) 105, a selector circuit (1) 106, a level shifter circuit 107, a D/A conversion circuit 108, and a selector circuit (2) 109. The source signal line side driving circuit A 101 supplies a picture signal (gradation voltage signal) to an odd-numbered source signal line.

The operation of the source signal line side driving circuit A 101 will be described. A start pulse and a clock signal are inputted to the shift register circuit 102. The shift register circuit 102 sequentially supplies a timing signal to the buffer circuit 103 based on the start pulse and the clock signal. Although described later, the shift register circuit 102 is constituted by a plurality of clocked inverters.

The timing signal from the shift register circuit 102 is buffered by the buffer circuit 103. A number of circuits or components are connected between the shift register circuit 102 and a source signal line connected to the pixel matrix circuit 116, so that the load capacity is large. In order to prevent "dulling" of the timing signal generated since the load capacity is large, this buffer circuit 103 is provided.

The timing signal buffered by the buffer circuit 103 is supplied to the latch circuit (1) 104. The latch circuit (1) 104 includes 960 latch circuits each processing 4-bit data. When the timing signal is inputted in the latch circuit (1) 104, a digital signal supplied from the digital video data dividing circuit 110 is sequentially taken in and is held by the latch circuit.

A time up to the end of writing of digital signals into all latch circuits of the latch circuit (1) 104 is called "one line period". That is, one line period is a time interval from a time point when writing of digital video data from the digital video data dividing circuit is started for the leftmost latch circuit in the latch circuit (1) 104 to a time point when writing of digital video data is ended for the rightmost latch circuit (1).

After the writing of the digital signals into the latch circuit (1) 104 is ended, when a latch pulse is flown through a latch pulse line connected to the latch circuit (2) 105 synchronously with the operation timing of the shift register circuit 102, the digital signals written in the latch circuit (1) 104 are transmitted to the latch circuit (2) 105 at the same time and are written.

In the latch circuit (1) 104 which completes transmission of the digital video data to the latch circuit (2) 105, writing of digital video data supplied from the digital video data dividing circuit is sequentially carried out again by the timing signal from the shift register circuit 102.

During this second one line period, the digital video data transmitted to the latch circuit (2) synchronously with the start of the second one line period are sequentially selected by the selector circuit (1) 106. The details of the selector circuit are disclosed in Japanese Patent Application No. Hei 9-286098 filed on Oct. 1, 1997 by the present assignee, which may be referred to. The entire disclosure of the Japanese Patent Application No. Hei 9-286098 including specification, claims, drawings and summary are incorporated herein by reference in its entirety.

Four-Bit digital video data are supplied to the level shifter circuit 107 from the latch circuit selected by the selector circuit. The voltage level of the digital video data is raised by the level shifter circuit 107, and the data are supplied to the D/A conversion circuit 108. The details of the D/A conversion circuit are disclosed in Japanese Patent Applications Nos. Hei 9-344,351 filed on Nov. 27, 1997 and Hei 9-365054 filed on Dec. 19, 1997 by the present assignee, which may be referred to. The entire disclosures of the above Japanese Patent Applications including specifications, claims, drawings and summaries are incorporated herein by references in their entirety.

The D/A conversion circuit 108 converts the 4-bit digital video data into an analog signal (gradation voltage), which is sequentially supplied to a source signal line selected by the selector circuit (2) 109. The analog signal supplied to the source signal line is supplied to a source region of a pixel TFT of the pixel matrix circuit 116 connected to the source signal line.

In the gate signal line side driving circuit A 112, a timing signal from a shift register 113 is supplied to a buffer circuit 114, and is supplied to a corresponding gate signal line (scanning line). Gate electrodes of pixel TFTs for one line are connected to the gate signal line, and all pixel TFTs for one line must be turned ON at the same time, so that the buffer circuit 114 having a large current capacity is used.

In this way, switching of the corresponding TFT is carried out by the scanning signal from the gate signal line side shift register, and the analog signal (gradation voltage) from the source signal line side driving circuit is supplied to the pixel TFT so that liquid crystal molecules are driven.

Reference numeral 111 denotes the source signal line side driving circuit B, and its structure is the same as the source signal line side driving circuit A 101. The source signal line side driving circuit B 111 supplies a picture signal to an even-numbered source signal line.

Reference numeral 110 denotes the digital video data dividing circuit. The digital video data dividing circuit 110 is a circuit for decreasing the frequency of digital video data inputted from the outside to a factor of 1/m. By dividing the digital video data, the frequency of a signal necessary for the operation of the driving circuit can also be decreased to a factor of 1/m.

Here, the digital video data dividing circuit 110 of this embodiment will be described in brief with reference to FIG. 2. Incidentally, Japanese Patent Application No. Hei 9-356238 filed on Dec. 8, 1997 by the same assignee discloses that the digital video dividing circuit is integrally formed on the same substrate as the pixel matrix circuit and other driving circuits. The above patent application discloses the details of the operation of the digital video data dividing circuit, and may be referred to for understanding of the operation of the digital video data dividing circuit of this embodiment. The entire disclosure of Japanese Patent Application No. Hei 9-356238 including specification, claims, drawings and summary are incorporated herein by reference in its entirety.

Figure 2:
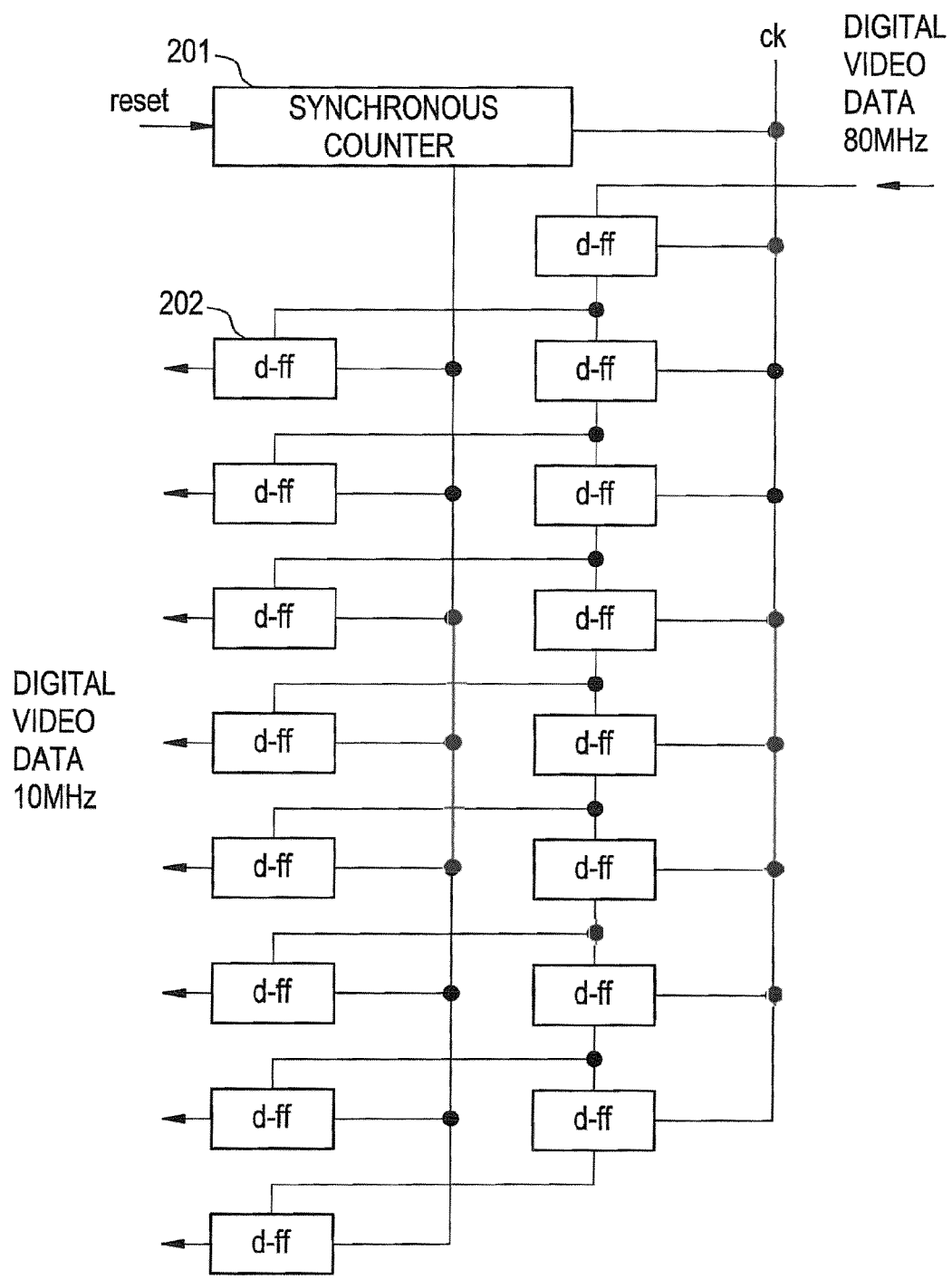
FIG. 2 is a circuit diagram showing an embodiment of a digital video data dividing circuit used for the driving circuit of the present invention.

In FIG. 2, reference numeral 201 denotes a synchronous counter, and a clock signal (ck) and a reset pulse (reset) are inputted. In this embodiment, digital video data of 80 MHz supplied from the outside is divided into 8 pieces, so that digital video data of 10 MHz are produced. Thus, sixteen D flip-flops 202 are connected as shown in FIG. 2. The digital video data of 10 MHz produced by the digital video data dividing circuit 110 are supplied to the latch circuit (1) 104 as described above.

Reference will be made to FIG. 1 again, and the operation of the gate signal line side driving circuit will be described. Reference numeral 112 denotes the gate signal line side driving circuit A. The gate signal line side driving circuit A 112 includes the shift register circuit 113 and the buffer circuit 114. The shift register circuit 113 supplies a timing signal to the buffer circuit 114. The buffer circuit 114 buffers the timing signal from the shift register circuit 113, and supplies it to the gate signal line (scanning line).

Reference numeral 115 denotes the gate signal line side driving circuit B, and has the same structure as the gate signal line side driving circuit A 112. In this embodiment, the gate signal line side driving circuits are provided in this way at both ends of the pixel matrix circuit 116, and both the gate signal line side driving circuits are operated, so that this embodiment can deal with even in the case where one does not operate.

The pixel matrix circuit 116 has such a structure that pixel TFTs, the number of which is 1920×1080 in horizontal and vertical, are arranged in matrix.

One screen (one frame) is formed by repeating the foregoing operation by the number of the scanning lines. In the active matrix type liquid crystal display device of this embodiment, updating of pictures of 60 frames per second are carried out.

Figure 3:
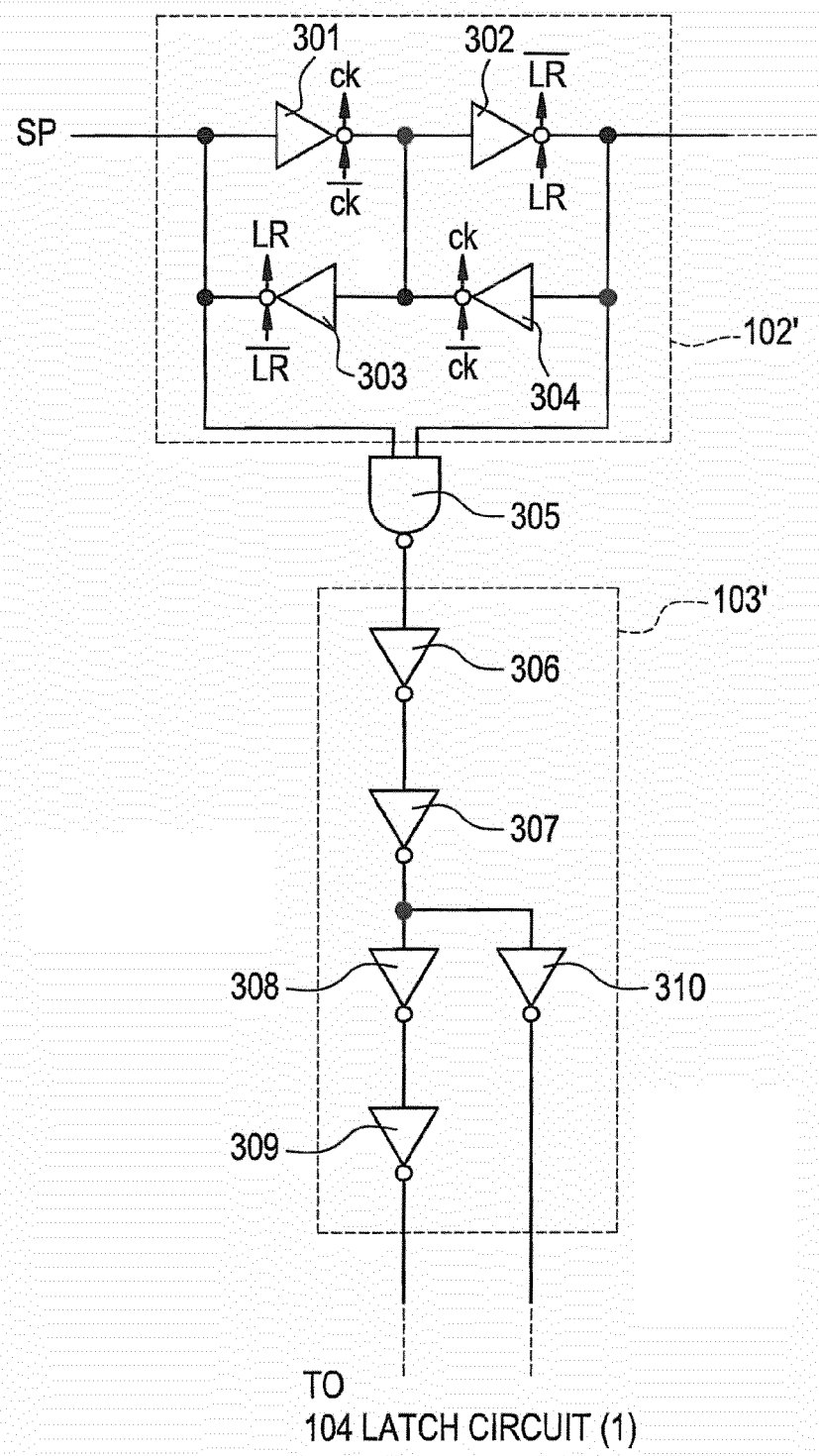
FIG. 3 is a circuit diagram showing an embodiment of a portion of a source signal line side shift register circuit and a portion of a buffer circuit used for the driving circuit of the present invention.

Here, a circuit diagram of a part (uppermost part) the shift register circuit 102 and the buffer circuit 103 of this embodiment will be shown in FIG. 3. FIG. 3 shows a flip-flop (FF) circuit 102' constituting the shift register circuit 102 and one portion of the buffer circuit 103' constituting the buffer circuit 103.

In this embodiment, the shift register circuit 102 is constituted by 240 such flip-flop circuits 102'. The flip-flop circuit 102' includes clocked inverters 301 to 304. Reference character ck denotes a clock signal. Reference character LR denotes a scanning direction charging signal. When the signal LR is high, a start pulse (SP) is supplied to the leftmost flip-flop circuit 102' of the shift register circuit 102, and the flip-flop circuit 102' transfers a signal from left to right. When the signal LR is low, a start pulse (SP) is supplied to the rightmost flip-flop circuit (not shown), and the flip-flop circuit 102' transfers a signal from right to left.

Explanation will be made below on the case, as an example, where the signal LR is a high signal, that is, the flip-flop circuits of the shift register circuit 102 operate from left to right.

A start pulse (SP) is inputted into the clocked inverter 301. When the start pulse is inputted into the clocked inverter 301, the clocked inverter 301 operates synchronously with a clock signal (ck) and an inverted clock signal (inverted ck), and outputs an inverted signal of an input signal. Since the signal LR (high) is inputted in the clocked inverter 302, the clocked inverter 302 receives the signal from the clocked inverter 301, and outputs its inverted signal. The clocked inverter 304 receives the signal from the clocked inverter 302, and outputs its inverted signal. Since the signal LR (high) is inputted in the clocked inverter 303, it does not operate. In this way, the flip-flop circuit 102' outputs a timing signal to a NAND circuit 305.

The timing signal from the shift register circuit 102 (flip-flop circuit 102') passes through the NAND circuit 305 and is supplied to the one portion of the buffer circuit 103'. In this embodiment, the one portion of the buffer circuit 103' includes five inverters 306 to 310. Although the one portion of the buffer circuit 103' includes five inverters in this embodiment, in the present invention, the number of inverters is not limited to this, but may include inverters which are less than five or larger than five in number.

These five inverters 306 to 310 are respectively constituted by TFTs with different sizes (channel widths). In this embodiment, the inverters 306, 307 and 308 are constituted by TFTs each having a channel width of 30 μm. The inverters 309 and 310 are constituted by TFTs each having a channel width of 100 μm. An optimum size selected through simulation or the like can be used for the size of the TFT constituting these inverters. Besides, the optimum size of the TFT can be determined according to the number of pixels of the semiconductor display device, or the like.

Figure 4:
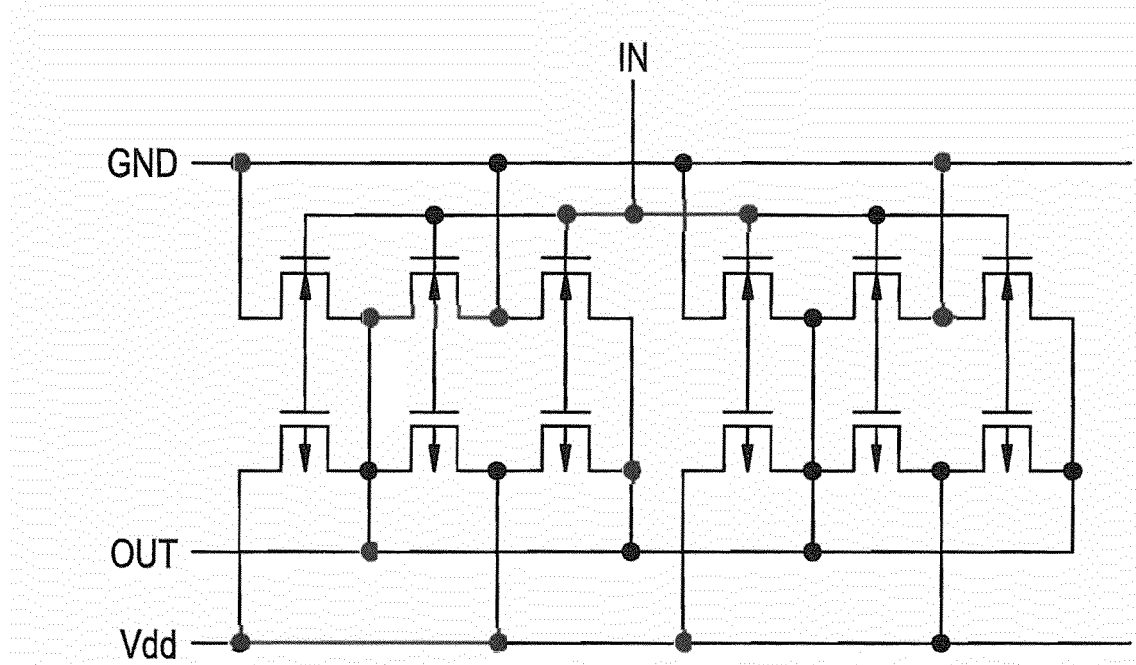
FIG. 4 is a circuit diagram showing an embodiment of an inverter used for the buffer circuit of the present invention.

Here, explanation will be made using the inverter 307 as an example. FIG. 4 is a circuit diagram of the inverter 307. The inverter 307 is constituted by six P-channel TFTs and six N-channel TFTs. The channel width of each of the TFTs is 30 μm. Incidentally, it is appropriate that the channel width of these TFTs is made 100 μm or less (preferably 90 μm or less).

As shown in FIG. 4, the inverter 307 has such a structure that two inverter circuits are connected in parallel with each other, each of the inverter circuits being constituted by a circuit in which three P-channel TFTs are connected in series with each other (triple gate TFTs are used in the circuit) and by a circuit in which three N-channel TFTs are connected in series with each other (triple gate TFTs are used in the circuit). Like this, when plural lines of TFTs each having a small channel width (30 μm in this embodiment) are combined, as compared with the case where an inverter is constituted by TFTs each having a large channel width, fluctuation in the TFTs can be eliminated. Moreover, heat generation and deterioration due to the large channel width can be prevented.

Figure 5:
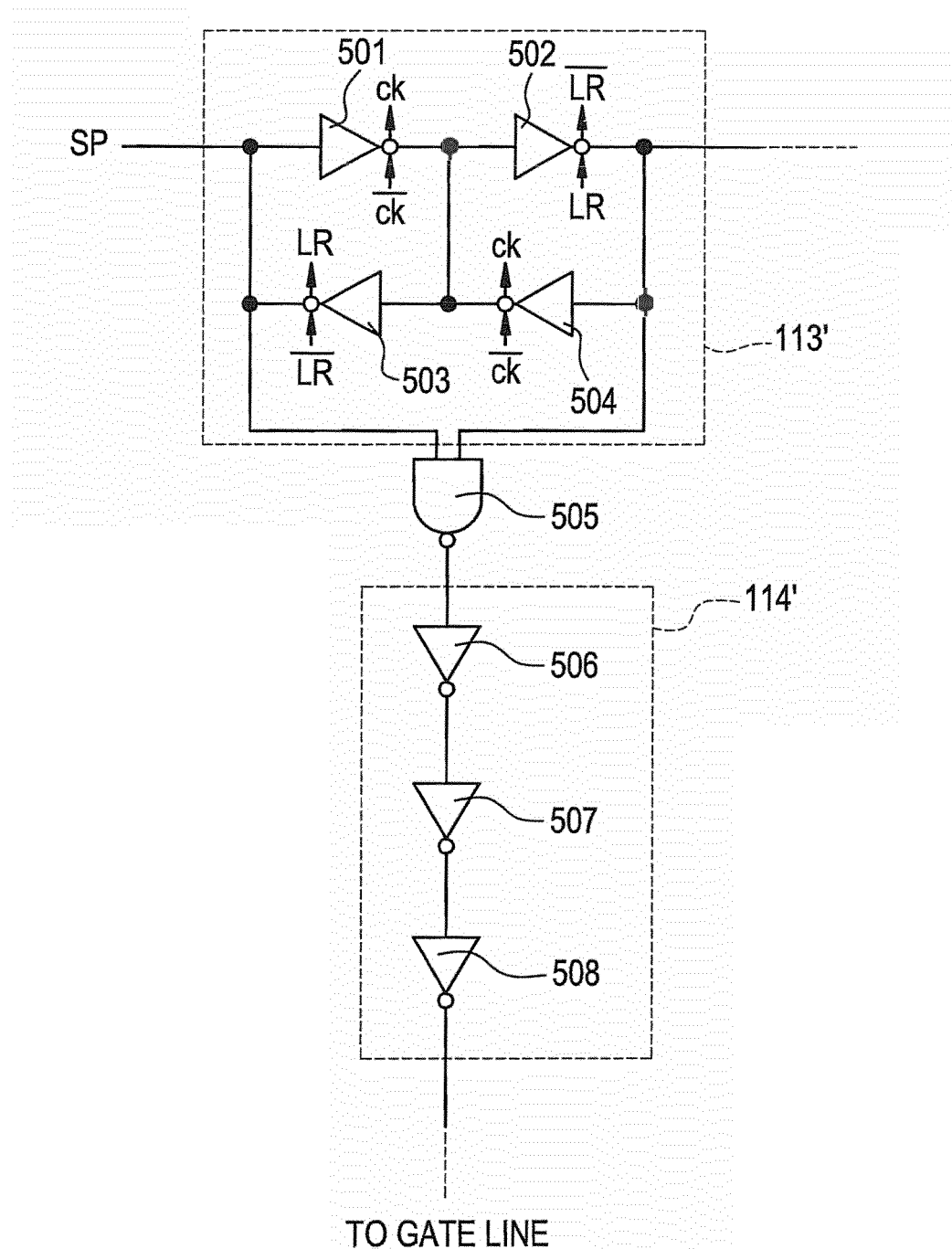
FIG. 5 is a circuit diagram showing an embodiment of a portion of a gate signal line side shift register circuit and a portion of a buffer circuit used for the driving circuit of the present invention.

Next, reference will be made to FIG. 5. FIG. 5 is a circuit diagram showing a part (uppermost portion) of the shift register circuit 113 and the buffer circuit 114 of the gate signal line side driving circuit A 112 of this embodiment, and shows a flip-flop circuit 113' constituting the shift register circuit 113 and a portion of the buffer circuit 114' constituting the buffer circuit 114.

In this embodiment, the shift register circuit 113 is constituted by 1080 such flip-flop circuits 113'. The flip-flop circuit 113' includes clocked inverters 501 to 504. Reference character ck denotes a clock signal. Reference character LR denotes a scanning direction changing signal, and when the signal LR is high, a start pulse (SP) is supplied to the leftmost flip-flop circuit 113' of the shift register circuit 113, and when the signal LR is low, the start pulse (SP) is supplied to the rightmost flip-flop circuit (not shown).

Since the operation of the shift register circuit 113 is the same as the shift register circuit 102 of the source signal line side driving circuit, its explanation will be omitted.

A timing signal from the shift register circuit 113 (flip-flop circuit 113') passes through a NAND circuit 505, and is supplied to the one portion of the buffer circuit 114'. The one portion of the buffer circuit 114' includes three inverters 506 to 508. In this embodiment, although the one portion of the buffer circuit 114' includes three inverters, in the present invention, the number of inverters is not limited to this, but may include inverters which are less than three or larger than three in number.

These three inverters 506 to 508 are constituted by TFTs each having a channel width of 90 μm. An optimum size selected through simulation or the like can be used for the size of the TFT constituting these inverters. Besides, the optimum size of the TFT can be determined according to the number of pixels of the semiconductor display device, or the like.

Figure 6:
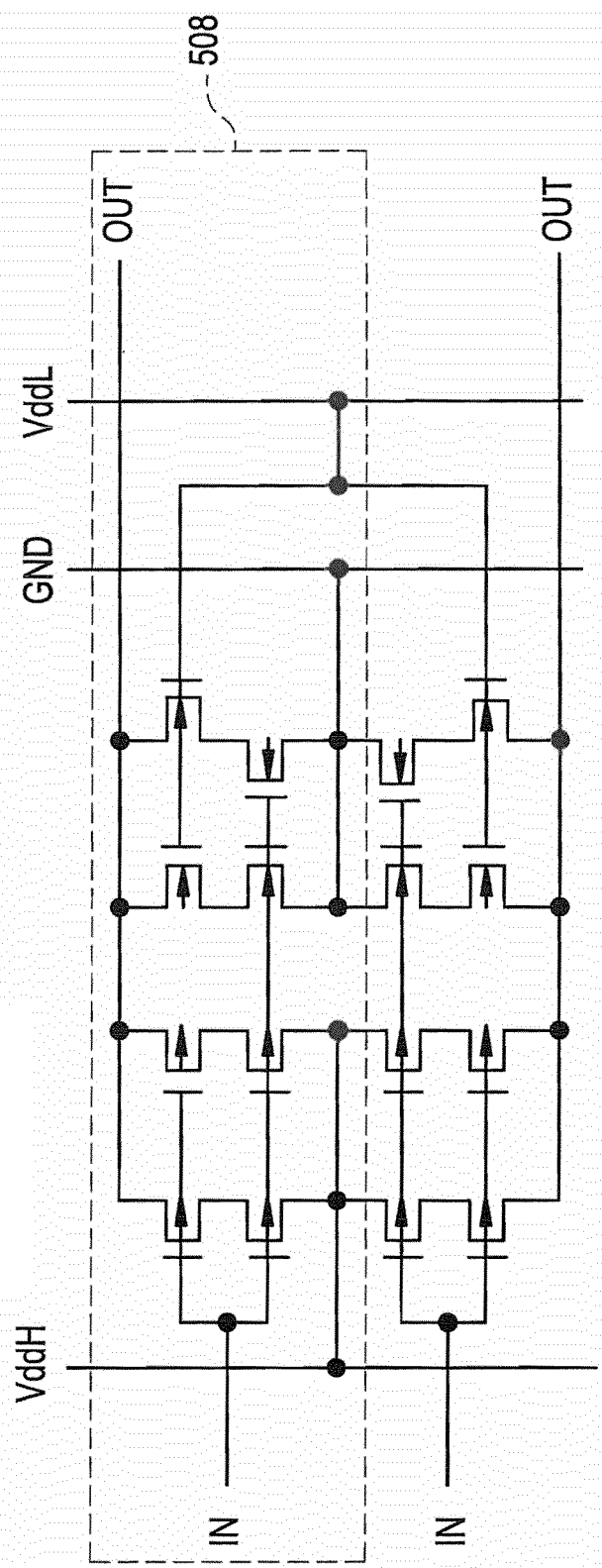
FIG. 6 is a circuit diagram showing an embodiment of an inverter used for the buffer circuit of the present invention.

FIG. 6 is a circuit diagram of the inverter 508. The inverter 508 is constituted by eight P-channel TFTs and eight N-channel TFTs. The channel width of each of the TFTs is 90 μm. It is appropriate that the channel width of these TFTs is 100 μm or less (preferably 90 μm or less).

As shown in FIG. 6, two circuits are connected in parallel with each other, each circuit being constituted by two P-channel TFTs connected in series with each other (actually, double gate TFTs are used). Moreover, two circuits are connected in parallel with each other, each circuit being constituted by two N-channel TFTs connected in series with each other (actually, double gate TFTs are used). The inverter 508 is constituted by these circuits. Like this, when a plurality of TFTs each having a small channel width are combined, as compared with the case where an inverter is constituted by TFTs each having a large channel width, fluctuation in the TFTs can be eliminated and current capacity can be secured. Moreover, heat generation and deterioration due to the large channel width can be prevented.

Figure 7:
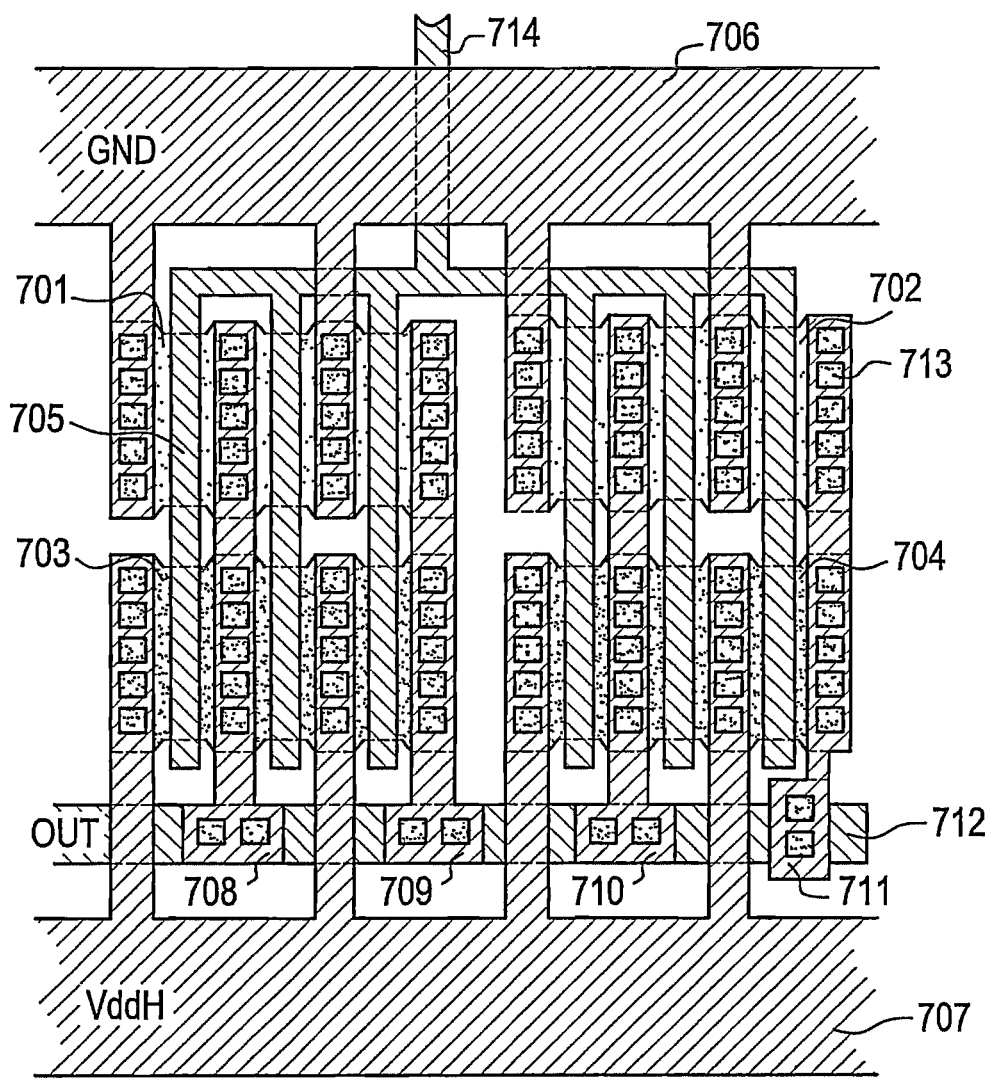
FIG. 7 is a circuit pattern diagram showing an embodiment of the inverter used for the driving circuit of the present invention.

FIG. 7 is a circuit pattern diagram of the inverter 307 shown in FIG. 4. In FIG. 7, reference numerals 701 and 702 denote semiconductor active layers added with N-type impurities. Reference numerals 703 and 704 denote semiconductor active layers added with P-type impurities. Reference numeral 705 denotes a gate electrode is wiring line and Al (aluminum) including Sc (scandium) of 2 wt % is used in this embodiment. Reference numerals 708 to 711 denote second wiring lines and Al is used in this embodiment. Reference numeral 712 denotes a wiring line existing in the same layer as the gate electrode wiring line. A blackened portion typically denoted by 713 is a portion where the gate electrode is connected to the second wiring line, or the semiconductor active layer is connected to the second wiring line.

Reference numeral 706 denotes a GND, 707 denotes a VddH (power source), 712 denotes an OUT (output), and 714 denotes an IN (input).

In the drawing, it is assumed that wiring lines with the same pattern exist in the same wiring line layer. A portion indicated by a broken line in the drawing shows the shape of a lower wiring line concealed by an upper wiring line.

In the inverter 307 shown in FIG. 7, although three P-channel TFTs and three N-channel TFTs are formed on the same semiconductor layer, it is also possible to adopt such a structure that three independent P-channel TFTs and three independent N-channel TFTs are formed on independent semiconductor layers, and are connected to each other by metal wiring or the like through contacts. However, the structure of this embodiment is preferable since the area of the inverter 307 can be made smaller.

Figure 8:
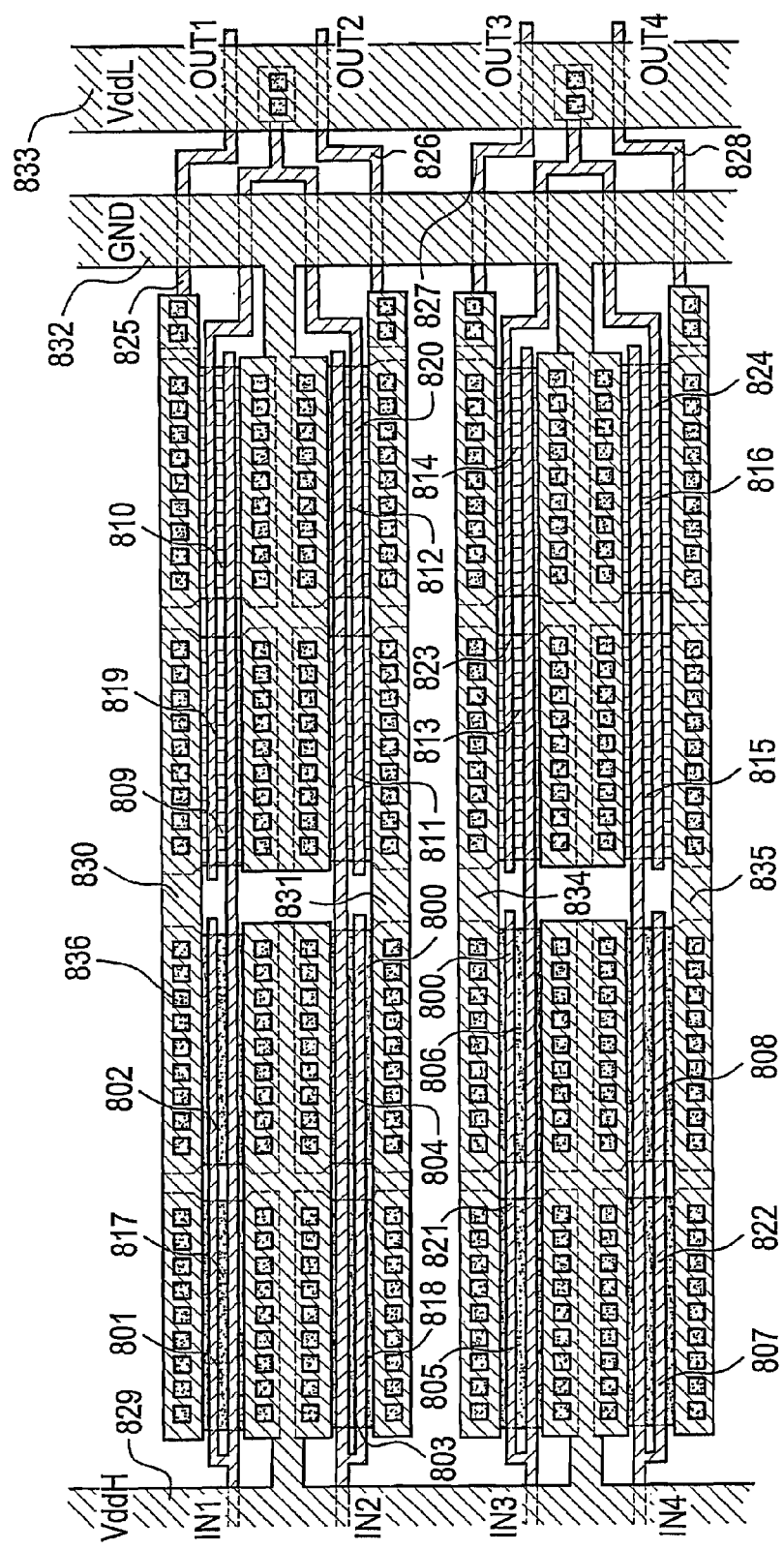
FIG. 8 is a circuit pattern diagram showing an embodiment of the inverter used for the driving circuit of the present invention.

Next, reference will be made to FIG. 8. FIG. 8 is a circuit pattern diagram of the inverter 508 shown in FIG. 6. In FIG. 8, in addition to the inverter 508, four inverters in total are shown.

In FIG. 8, reference numerals 801 to 808 denote semiconductor active layers added with P-type impurities. Reference numerals 809 to 816 denote semiconductor active layers added with N-type impurities. Reference numerals 817 to 824 denote gate electrode wiring lines, and Al (aluminum) including Sc (scandium) of 2 wt % is used in this embodiment. Reference numerals 825 to 828 denote wiring lines existing in the same layer as the gate electrode wiring lines. Reference numerals 829 to 835 denote second wiring lines, and Al is used in this embodiment. A blackened portion typically denoted by 836 is a portion where the gate electrode is connected to the second wiring line, or the semiconductor active layer is connected to the second wiring line.

Reference numeral 829 denotes a VddH (high voltage power source), 832 denotes a GND, and 833 denote a VddL (low voltage power source). Incidentally, each of reference characters IN1 to IN4 denote an input, and each of OUT1 to OUT4 denote an output.

In the drawing, wiring lines with the same pattern are made of the same material and exist on the same wiring layer. A portion indicated by a broken line in the drawing shows the shape of a lower wiring line concealed by an upper wiring line.

Here, a manufacturing method of an active matrix type liquid crystal display device including the driving circuit of this embodiment will be described. Incidentally, the manufacturing method described below is one manufacturing method which realizes the present invention, and the active matrix type liquid crystal display device of the present invention can be realized by other manufacturing methods.

Here, an example in which a plurality of TFTs are formed on a substrate having an insulating surface, and a pixel matrix circuit, a driving circuit, a logic circuit, and the like are monolithically formed, will be described with references to FIGS. 9 to 12. In this embodiment, a state in which one pixel of a pixel matrix circuit and a CMOS circuit as a basic circuit of other circuits (driving circuit, logic circuit, etc.) are formed at the same time, will be shown. In this embodiment, although manufacturing steps will be described for the case where each of a P-channel TFT and an N-channel TFT includes one gate electrode, a CMOS circuit of TFTs each having a plurality of gate electrodes, such as a double gate type or a triple gate type TFT, can also be manufactured in the same way.

Reference will be made to FIGS. 9A to 9D. First, a quartz substrate 901 is prepared as a substrate having an insulating surface. Instead of the quartz substrate, a silicon substrate on which a thermal oxidation film is formed may be used. Moreover, such a method may be adopted that an amorphous silicon film is temporarily formed on a quartz substrate and the film is completely thermally oxidized to form an insulating film. In addition, a quartz substrate or a ceramic substrate each having a silicon nitride film formed as an insulating film may be used.

An amorphous silicon film 902 is formed on the substrate 901 by a low pressure CVD method, a plasma CVD method, or a sputtering method. Adjustment is made so that the final film thickness (film thickness determined after paying consideration to a film decrease subsequent to thermal oxidation) of the amorphous silicon film 902 becomes 10 to 100 nm (preferably 30 to 60 nm). In the film formation, it is important to thoroughly manage the concentration of impurities in the film.

In this embodiment, although the amorphous silicon film 902 is formed on the substrate 901, another semiconductor thin film may be used instead of the amorphous silicon film. For example, it is also possible to use a compound of silicon and germanium indicated by $Si_XGe_{1-X}$ (0<X<1).

In the case of this embodiment, management is made so that the concentration of each of C (carbon) and N (nitrogen), which are impurities to block crystallization in the amorphous silicon film 902, becomes less than $5\times10^{18}$ atoms/cm$^3$ (typically, $5\times10^{17}$ atoms/cm$^3$ or less, preferably $2\times10^{17}$ atoms/cm$^3$ or less), and the concentration of O (oxygen) becomes less than $1.5\times10^{19}$ atoms/cm$^3$ (typically $1\times10^{18}$ atoms/cm$^3$ or less, preferably $5\times10^{17}$ atoms/cm$^3$ or less). This is because if the concentration of any one of the impurities exceeds the above value, the impurity may have a bad influence on subsequent crystallization and may degrade a film quality after the crystallization. In the present specification, the foregoing concentration of the impurity element in the film is defined as a minimum value in measurement results of SIMS (Secondary Ion Mass Spectroscopy).

In order to obtain the above structure, it is desirable to periodically carry out dry cleaning of a low pressure thermal CVD furnace used in this embodiment so that a film growth chamber is made clean. It is appropriate that the dry cleaning of the film growth chamber is carried out by flowing a $ClF_3$ (chlorine fluoride) gas of 100 to 300 sccm into the furnace heated up to about 200 to 400° C. and by using fluorine produced by pyrolysis.

According to the knowledge of the present inventors, in the case where the temperature in the furnace is made 300° C. and the flow rate of the $ClF_3$ (chlorine fluoride) gas is made 300 sccm, it is possible to completely remove an incrustation (including silicon as its main ingredient) with a thickness of about 2 µm in four hours.

The concentration of hydrogen in the amorphous silicon film 902 is also a very important parameter, and it appears that as the hydrogen content is made low, a film with superior crystallinity is obtained. Thus, it is preferable to form the amorphous silicon film 902 by a low pressure CVD method. A plasma CVD method may also be used if film forming conditions are optimized.

It is effective to add an impurity element (element in group 13, typically boron, or element in group 15, typically phosphorus) for controlling a threshold voltage ($V_{th}$) of a TFT at film formation of the amorphous silicon film 902. It is necessary to determine the amount of addition in view of $V_{th}$ in the case where the above impurity for controlling $V_{th}$ is not added.

Next, the amorphous silicon film 902 is crystallized. A technique disclosed in Japanese Patent Unexamined Publication No. Hei 7-130652 published on May 19, 1995 (filed on Oct. 29, 1993) is used as a means for crystallization. Although both means of embodiment 1 and embodiment 2 disclosed in the publication may be used, in this embodiment, it is preferable to use the technical content (described in detail in Japanese Patent Unexamined Publication No. Hei 8-78329 published on Mar. 22, 1996, filed on Sep. 5, 1994) set forth in the embodiment 2 of the publication. The entire disclosures of both Japanese Patent Unexamined Publications Nos. Hei 7-130652 and Hei 8-78329 including specification, claims, drawings and summary, respectively, are incorporated herein by references in their entirety.

According to the technique disclosed in Japanese Patent Unexamined Publication No. Hei 8-78329, a mask insulating film 903 for selecting an added region of an element for facilitating crystallization of the amorphous silicon film is first formed. The mask insulating film 903 has a plurality of openings for addition of the element for facilitating crystallization of the amorphous silicon film. Positions of crystal regions can be determined by the positions of the openings.

Figure 9A:
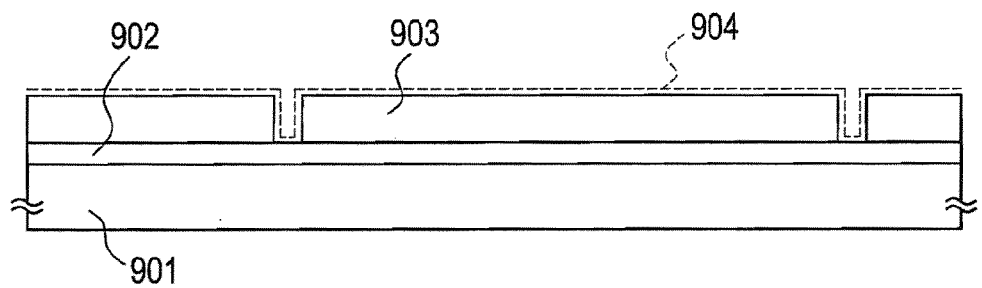
FIGS. 9A to 9D are views showing manufacturing steps of an active matrix type liquid crystal display device including a driving circuit of the present invention.

A solution including nickel (Ni) as the element for facilitating crystallization of the amorphous silicon film is applied by a spin coating method to form a Ni including layer 904. As the element, cobalt (Co), iron (Fe), palladium (Pd), germanium (Ge), platinum (Pt), copper (Cu), gold (Au), or the like may be used other than nickel (FIG. 9A).

As the foregoing adding step of the element for facilitating crystallization of the amorphous silicon film, an ion implantation method or a plasma doping method using a resist mask may also be used. In this case, since it becomes easy to decrease an occupied area of an added region and to control a growth distance of a lateral growth region, the method becomes an effective technique when a minute circuit is formed.

Next, after the adding step of the element is ended, dehydrogenating is carried out at about 500° C. for 2 hours, and then, a heat treatment is carried out in an inert gas atmosphere, hydrogen atmosphere, or oxygen atmosphere at a temperature of 500 to 700° C. (typically 550 to 650° C., preferably 570° C.) for 4 to 24 hours to crystallize the amorphous silicon film 902. In this embodiment, a heat treatment is carried out in a nitrogen atmosphere, at 570° C., and for 14 hours.

Figure 9B:
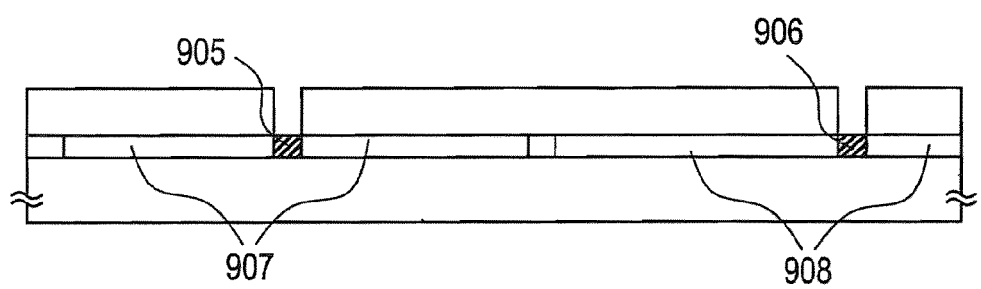

At this time, crystallization of the amorphous silicon film 902 progresses first from nuclei produced in regions 905 and 906 added with nickel, and crystal regions 907 and 908 grown almost parallel to the surface of the substrate 901 are formed. The crystal regions 907 and 908 are respectively referred to as a lateral growth region. Since respective crystals in the lateral growth region are gathered in a comparatively uniform state, the lateral growth region has such an advantage that the total crystallinity is superior (FIG. 9B).

Incidentally, even in the case where the technique set forth in embodiment 1 of the above-mentioned Japanese Patent Unexamined Publication No. Hei 7-130652 is used, a region which can be called a lateral growth region is microscopically formed. However, since production of nuclei occurs irregularly in the surface, it is difficult to control crystal grain boundaries.

Figure 9C:
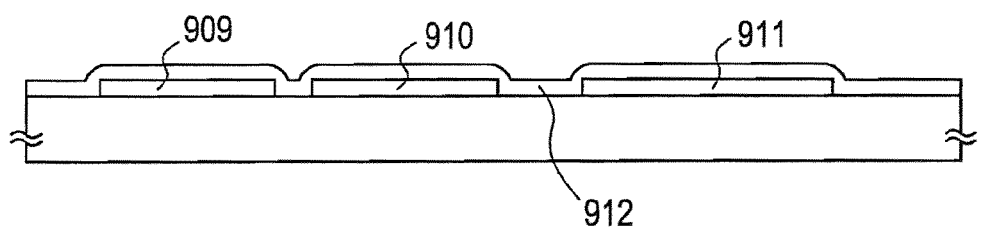

After the heat treatment for crystallization is ended, the mask insulating film 903 is removed and patterning is carried out, so that island-like semiconductor layers (active layers) 909, 910, and 911 made of the lateral growth regions 907 and 908 are formed (FIG. 9C).

Here, reference numeral 909 denotes the active layer of the N-channel TFT constituting the CMOS circuit, 910 denotes the active layer of the P-channel TFT constituting the CMOS circuit, and 911 denotes the active layer of the N-channel TFT (pixel TFT) constituting the pixel matrix circuit.

After the active layers 909, 910 and 911 are formed, a gate insulating film 912 made of an insulating film including silicon is formed thereon (FIG. 9C).

Figure 9D:
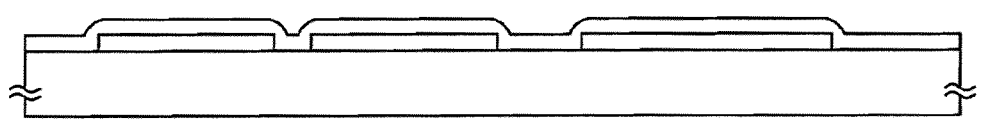

Next, as shown in FIG. 9D, a heat treatment (gettering process for the element for facilitating crystallization of the amorphous silicon film) for removing or reducing the element for facilitating crystallization of the amorphous silicon film (nickel) is carried out. In this heat treatment, a halogen element is made contained in a processing atmosphere and the gettering effect for a metallic element by the halogen element is used.

In order to sufficiently obtain the gettering effect by the halogen element, it is preferable to carry out the above heat treatment at a temperature exceeding 700° C. If the temperature is not higher than 700° C., it becomes difficult to decompose a halogen compound in the processing atmosphere, so that there is a fear that the gettering effect can not be obtained.

Thus, in this embodiment, the heat treatment is carried out at a temperature exceeding 700° C., preferably 800 to 1000° C. (typically 950° C.), and a processing time is made for 0.1 to 6 hours, typically 0.5 to 1 hour.

In this embodiment, there is shown an example in which a heat treatment is carried out in an oxygen atmosphere including hydrogen chlorine (HCl) of 0.5 to 10 vol % (in this embodiment, 3 vol %) at 950° C. for 30 minutes. If the concentration of HCl is higher than the above-mentioned concentration, asperities comparable to a film thickness are produced on the surfaces of the active layers 909, 910 and 911. Thus, such a high concentration is not preferable.

Although an example in which the HCl gas is used as a compound including a halogen element has been described, one kind or plural kinds of gases selected from compounds including halogen, such as typically HF, $NF_3$, HBr, $Cl_2$, $ClF_3$, $BCl_2$, $F_2$, and $Br_2$, may be used other than the HCl gas.

In this step, it is conceivable that nickel is removed in such a manner that nickel in the active layers 909, 910 and 911 is gettered by the action of chlorine and is transformed into volatile nickel chloride which is released into the air. By this step, the concentration of nickel in the active layers 909, 910 and 911 is lowered down to $5 \times 10^{17}$ atoms/cm$^3$ or less.

Incidentally, the value of $5 \times 10^{17}$ atoms/cm$^3$ is the lower limit of detection in the SIMS (Secondary Ion Mass Spectroscopy). As the result of analysis of TFTs experimentally produced by the present inventors, when the concentration is not higher than $1 \times 10^{18}$ atoms/cm$^3$ (preferably $5 \times 10^{17}$ atoms/cm$^3$ or less), an influence of nickel upon TFT characteristics can not be ascertained. However, the concentration of an impurity in the present specification is defined as the minimum value in measurement results of the SIMS analysis.

By the above heat treatment, a thermal oxidation reaction progresses at the interface between the gate insulating film 912 and the active layers 909, 910 and 911, so that the thickness of the gate insulating film 912 is increased by the thickness of a thermal oxidation film. When the thermal oxidation film is formed in this way, it is possible to obtain an interface of semiconductor/insulating film, which has very few interfacial levels. Moreover, there is also an effect to prevent inferior formation (edge thinning) of the thermal oxidation film at the end of the active layer.

The gettering process of the element for facilitating crystallization of the amorphous silicon film may be carried out after the mask insulating film 903 is removed and before the active layer is patterned. And also, the gettering process of the element for facilitating crystallization of the amorphous silicon film may be carried out after the active layer is patterned. Besides, any gettering processes may be combined.

Incidentally, the gettering process of the element for facilitating crystallization of the amorphous silicon film can also be carried out by using. P (phosphorus). The gettering process by phosphorus may be combined with the foregoing gettering process. Only the gettering process by phosphorus may be used.

Further, it is also effective that after the heat treatment in the above-mentioned halogen atmosphere is carried out, a heat treatment approximately at 950° C. for one hour is carried out in a nitrogen atmosphere to improve the film quality of the gate insulating film 912.

Incidentally, it is also ascertained by the SIMS analysis that the halogen element, which was used for the gettering process, having a concentration of $1 \times 10^{15}$ to $1 \times 10^{20}$ atoms/cm$^3$ remains in the active layers 909, 910 and 911. Moreover, it is also ascertained by the SIMS analysis that at that time, the foregoing halogen element with a high concentration is distributed between the thermal oxidation film formed by the heat treatment and the active layers 909, 910 and 911.

As the result of the SIMS analysis for other elements, it was ascertained that the concentration of any of C (carbon), N (nitrogen), O (oxygen), and S (sulfur) as typical impurities was less than $5\times10^{18}$ atoms/cm$^3$ (typically $1\times10^{18}$ atoms/cm$^3$ or less).

The lateral growth region of the thus obtained active layer has a unique crystal structure made of a collective of rod-like or flattened rod-like crystals. The features of the unique crystal structure will be described later.

Figure 10A:
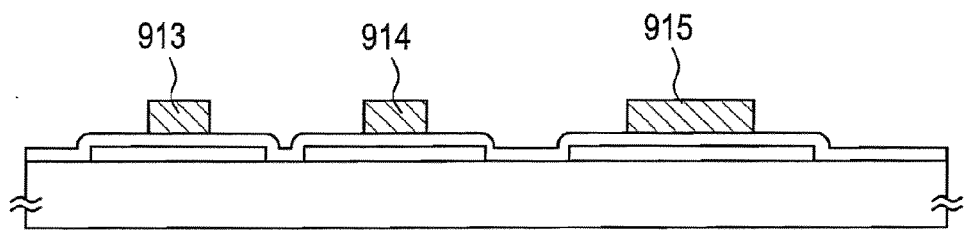
FIGS. 10A to 10D are views showing manufacturing steps of the active matrix type liquid crystal display device including the driving circuit of the present invention.

Next, reference will be made to FIGS. 10A to 10D. First, a not-shown metal film including aluminum as its main ingredient is formed, and originals 913, 914 and 915 of subsequent gate electrodes are formed by patterning. In this embodiment, an aluminum film including scandium of 2 wt % is used (FIG. 10A).

Incidentally, a polycrystalline silicon film added with impurities may be used for the gate electrode, instead of the aluminum film including scandium of 2 wt %.

Figure 10B:
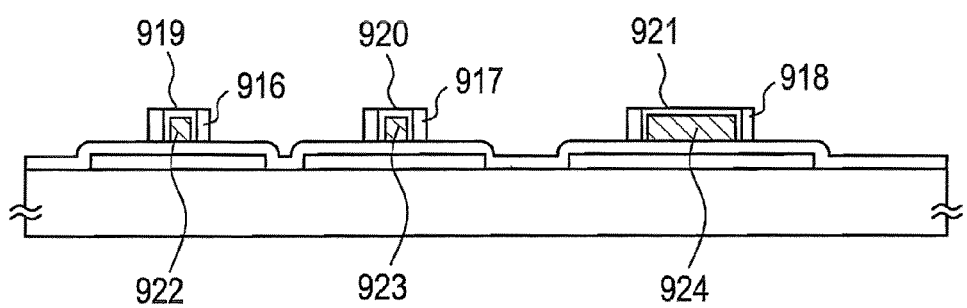
Figure 10C:
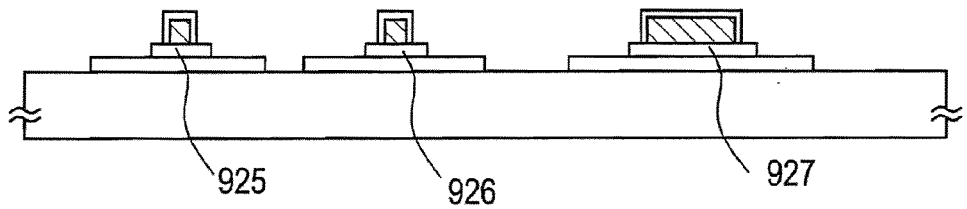

Next, by a technique disclosed in Japanese Patent Unexamined Publication No. Hei 7-135318 published on May 23, 1995 (filed on Nov. 5, 1993), porous anodic oxidation films 916, 917 and 918, nonporous anodic oxidation films 919, 920 and 921, and gate electrodes 922, 923 and 924 are formed (FIG. 10B). The entire disclosure of Japanese Patent Unexamined Publication No. Hei 7-135318 including specification, claims, drawings and summary are incorporated herein by reference in its entirety.

After the state shown in FIG. 10B is obtained in this way, the gate insulating film 912 is next etched by using the gate electrodes 922, 923 and 924, and the porous anodic oxidation films 916, 917 and 918 as masks. Then the porous anodic oxidation films 916, 917 and 918 are removed to obtain the state shown in FIG. 10C. Incidentally, reference numerals 925, 926 and 927 in FIG. 10C denote gate insulating films after processing.

Next, an adding step of an impurity element giving one conductivity is carried out. As the impurity element, P (phosphorus) or As (arsenic) may be used for an N-channel type, and B (boron) or Ga (gallium) may be used for a P-channel type.

In this embodiment, each of adding steps of impurities for forming an N-channel TFT and a P-channel TFT is divided into two steps and is carried out.

First, the addition of impurities for forming the N-channel TFT is carried out. The first impurity addition (P (phosphorus) is used in this embodiment) is carried out at a high acceleration voltage of about 80 kV to form an n$^-$ region. Adjustment is made so that the concentration of the P ion in the n$^-$ region becomes $1\times10^{18}$ atoms/cm$^3$ to $1\times10^{19}$ atoms/cm$^{3-}$.

Further, the second impurity addition is carried out at a low acceleration voltage of about 10 kV to form an n$^+$ region. Since the acceleration voltage is low at this time, the gate insulating film functions as a mask. Adjustment is made so that the sheet resistance of the n$^+$ region becomes 500Ω or less (preferably 300Ω or less).

Through the above described steps, a source region 928, a drain region 929, a low concentration impurity region 930, and a channel formation region 931 of the N-channel TFT constituting the CMOS circuit are formed. Moreover, a source region 932, a drain region 933, a low concentration impurity region 934, and a channel formation region 935 of the N-channel TFT constituting the pixel TFT are defined (FIG. 10D).

Figure 10D:
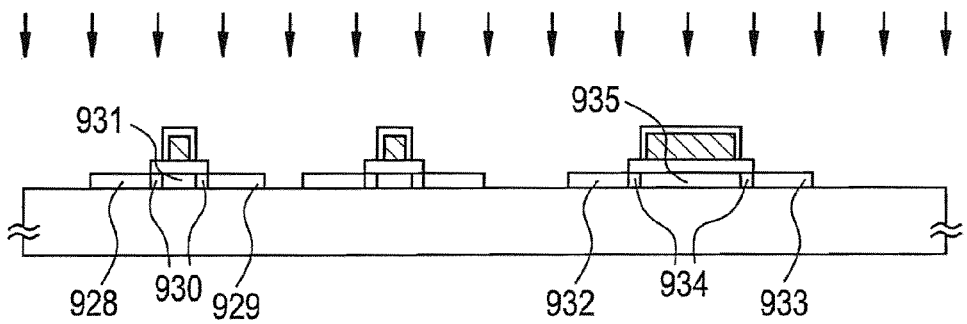

In the state shown in FIG. 10D, the active layer of the P-channel TFT constituting the CMOS circuit has the same structure as the active layer of the N-channel TFT.

Figure 11A:
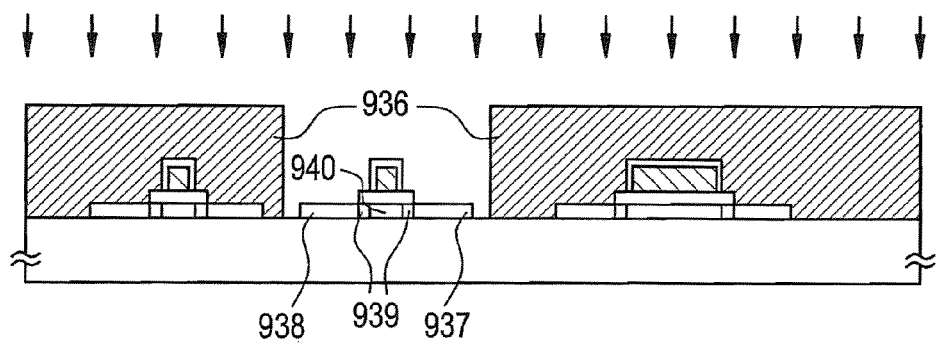
FIGS. 11A to 11C are views showing manufacturing steps of the active matrix type liquid crystal display device including the driving circuit of the present invention.

Next, as shown in FIG. 11A, a resist mask 936 covering the N-channel TFTs is provided, and an impurity ion for giving a P type (boron is used in this embodiment) is added.

Although this step is also divided and is carried out two times like the foregoing adding step of the impurity, since the N-channel type must be inverted into the P-channel type, the B (boron) ion with a concentration several times the foregoing addition concentration of the P ion is added.

In this way, a source region 937, a drain region 938, a low concentration impurity region 939, and a channel formation region 940 of the P-channel TFT constituting the CMOS circuit are formed (FIG. 11A).

After the active layer is completed in the manner as described above, activation of the impurity ions is made by combination of furnace annealing, laser annealing, lamp annealing, and the like. At the same time, damages of the active layers caused in the adding steps are repaired.

Next, as an interlayer insulating film 941, a laminated film of a silicon oxide film and a silicon nitride film is formed. Next, after contact holes are formed in the interlayer insulating film, source electrodes 942, 943 and 944, and drain electrodes 945 and 946 are formed to obtain the state shown in FIG. 11B. An organic resin film may be used as the interlayer insulating film 941.

Figure 11B:
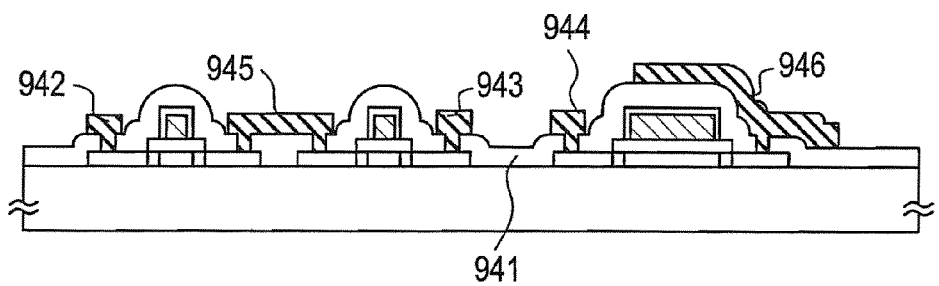

After the state shown in FIG. 11B is obtained, a first interlayer insulating film 947 made of an organic resin film and having a thickness of 0.5 to 3 μm is formed. Polyimide, acryl, polyimide amide, or the like may be used for the organic resin film. The merits of using the organic resin film are listed as follow: a film forming method is simple; a film thickness can be easily increased; parasitic capacitance can be reduced since its relative dielectric constant is low; and flatness is excellent. An organic resin film other than the above may be used.

Next, a black matrix 948 made of a film having shading properties and having a thickness of 100 nm is formed on the first interlayer insulating film 947. Although a titanium film is used as the black matrix 948 in this embodiment, a resin film including black pigments, or the like may be used.

In the case where the titanium film is used for the black matrix 948, part of wiring lines of a driving circuit or other peripheral circuit portions can be formed of titanium. The wiring lines of titanium can be formed at the same time as the formation of the black matrix 948.

Figure 11C:
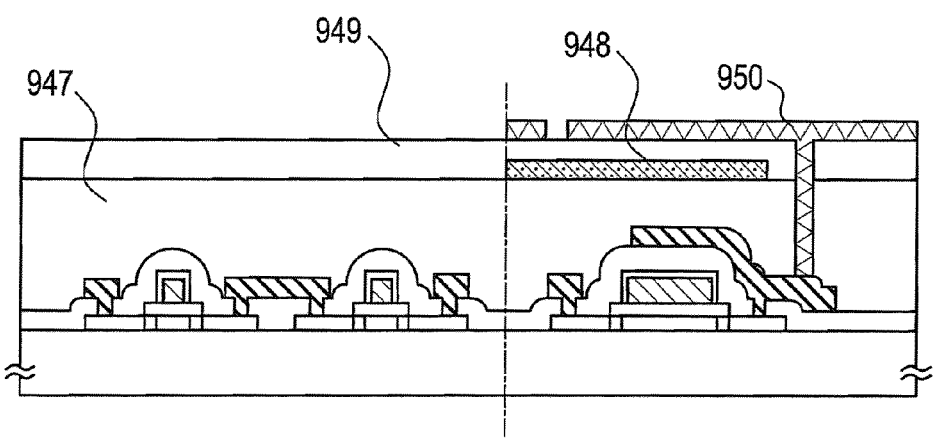

After the black matrix 948 is formed, a second interlayer insulating film 949 made of one of a silicon oxide film, a silicon nitride film, and an organic resin film, or a laminated film thereof and having a thickness of 0.1 to 0.3 μm is formed. A contact hole is formed in the interlayer insulating film 947 and the interlayer insulating film 949, and a pixel electrode 950 with a thickness of 120 nm is formed. According to the structure of this embodiment, auxiliary capacitance is formed at a region where the black matrix 948 overlaps with the pixel electrode 950 (FIG. 11C). Since this embodiment relates to a transmission type active matrix liquid crystal display device, a transparent conductive film of ITO or the like is used as a conductive film forming the pixel electrode 950.

Next, the entire of the substrate is heated in a hydrogen atmosphere at a temperature of 350° C. for 1 to 2 hours to hydrogenate the entire of the device, so that the dangling bonds (unpaired bonds) in the film (especially in the active layer) are compensated. Through the above steps, it is possible to manufacture the CMOS circuit and the pixel matrix circuit on the same substrate.

Figure 12:
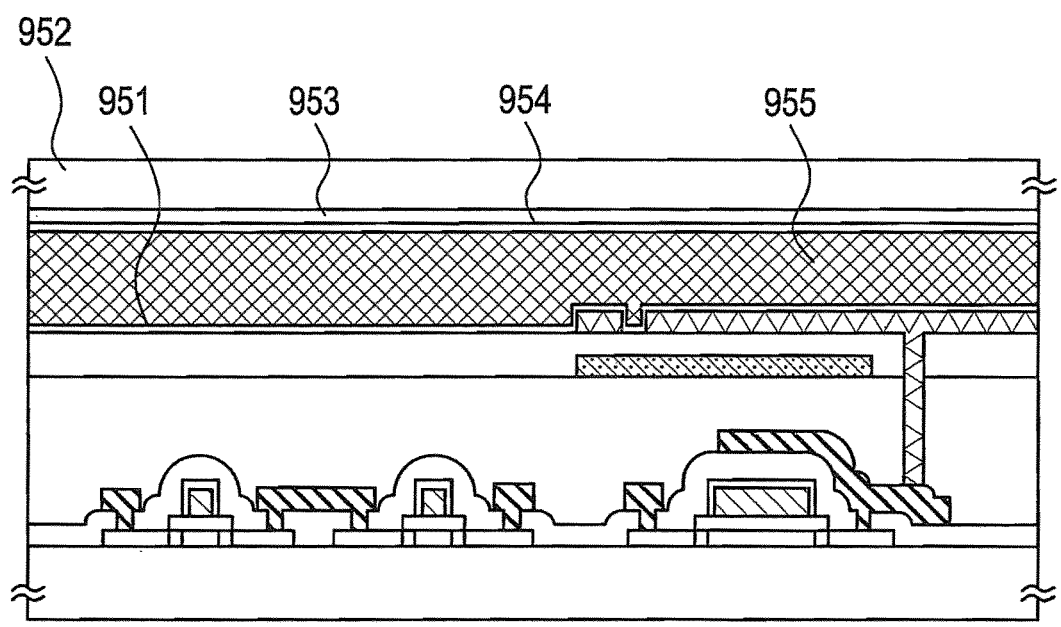
FIG. 12 is a view showing the active matrix type liquid crystal display device including the driving circuit of the present invention.

Next, with reference to FIG. 12, a step of manufacturing an active matrix type liquid crystal display device on the basis of the active matrix substrate manufactured through the above steps will be described.

An oriented film 951 is formed on the active matrix substrate in the state of FIG. 11C. In this embodiment, polyimide is used for the oriented film 951. Next, an opposite substrate is prepared. The opposite substrate is constituted by a glass substrate 952, a transparent conductive film 953, and an oriented film 954.

In this embodiment, such a polyimide film that liquid crystal molecules are oriented parallel to the substrate is used as the oriented film. Incidentally, after the oriented film is formed, a rubbing process is carried out so that the liquid crystal molecules are parallel oriented with a fixed pretilt angle.

Next, the active matrix substrate obtained through the above steps and the opposite substrate are bonded to each other through a sealing material, a spacer, and the like (not shown) by the well-known cell-assembly process. Thereafter, a liquid crystal material 955 is injected between both the substrates, and is completely sealed with a sealing agent (not shown). Thus, the transmission type active matrix liquid crystal display device as shown in FIG. 12 is completed.

Various known liquid crystal materials such as twisted nematic liquid crystal, polymer dispersion liquid crystal, ferroelectric liquid crystal, anti-ferroelectric liquid crystal, or a mixture of ferroelectric and anti-ferroelectric liquid crystals may be used in the liquid crystal display of this example.

In this embodiment, the liquid crystal panel is designed to make display with a TN (twisted nematic) mode. Thus, a pair of polarizing plates (not shown) are disposed so that the liquid crystal panel is held between the polarizing plates in crossed Nicols (in such a state that polarizing axes of the pair of polarizing plates cross each other at right angles).

Thus, it is understood that in this embodiment, display is made in a normally white mode in which the liquid crystal display device becomes in a white display state when a voltage is not applied thereto.

In the liquid crystal panel of this embodiment, the active matrix substrate is exposed only at an end surface where an FPC is attached, and other three end surfaces of the active matrix substrate are flush with those of the opposite substrate.

It is understood that through the above described manufacturing method, in the active matrix type liquid crystal display device of this embodiment, the driving circuit, other peripheral devices, and pixels can be integrally formed on the insulating substrate such as a quartz substrate or a glass substrate.

Figure 13:
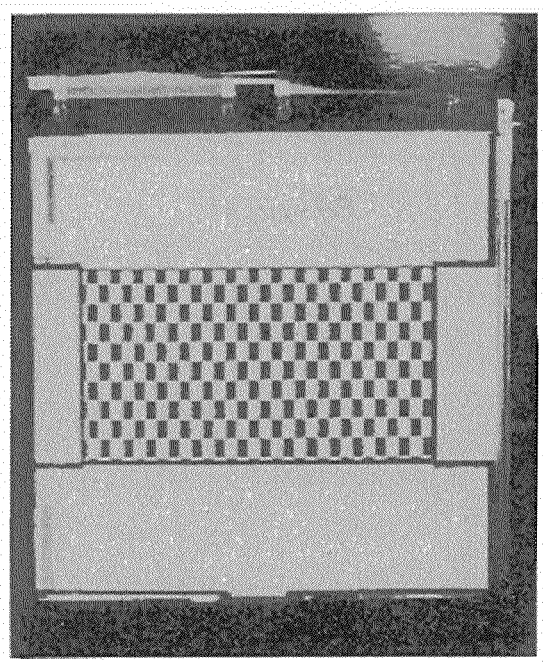
FIG. 13 is a view showing the outer appearance of an active matrix type liquid crystal display device including a driving circuit of the present invention.

FIG. 13 shows the active matrix type liquid crystal display device manufactured by the foregoing manufacturing method. FIG. 13 shows the outer appearance of the active matrix type liquid crystal display device when a check pattern is displayed.

Although the active matrix type liquid crystal display device shown in FIG. 13 displays a black and white check pattern, when three such active matrix type liquid crystal display devices are used, a full color projection type liquid crystal display device can be realized.

Here, the features of the crystal structure of the lateral growth region of the semiconductor layer obtained through the manufacturing method of this embodiment will be described.

The lateral growth region formed in accordance with the foregoing manufacturing method has microscopically a crystal structure in which a plurality of rod-like (or flattened rod-like) crystals are arranged in almost parallel to each other and with regularity to a specific direction. This can be easily ascertained by observation with a TEM (Transmission Electron Microscope).

Figure 14:
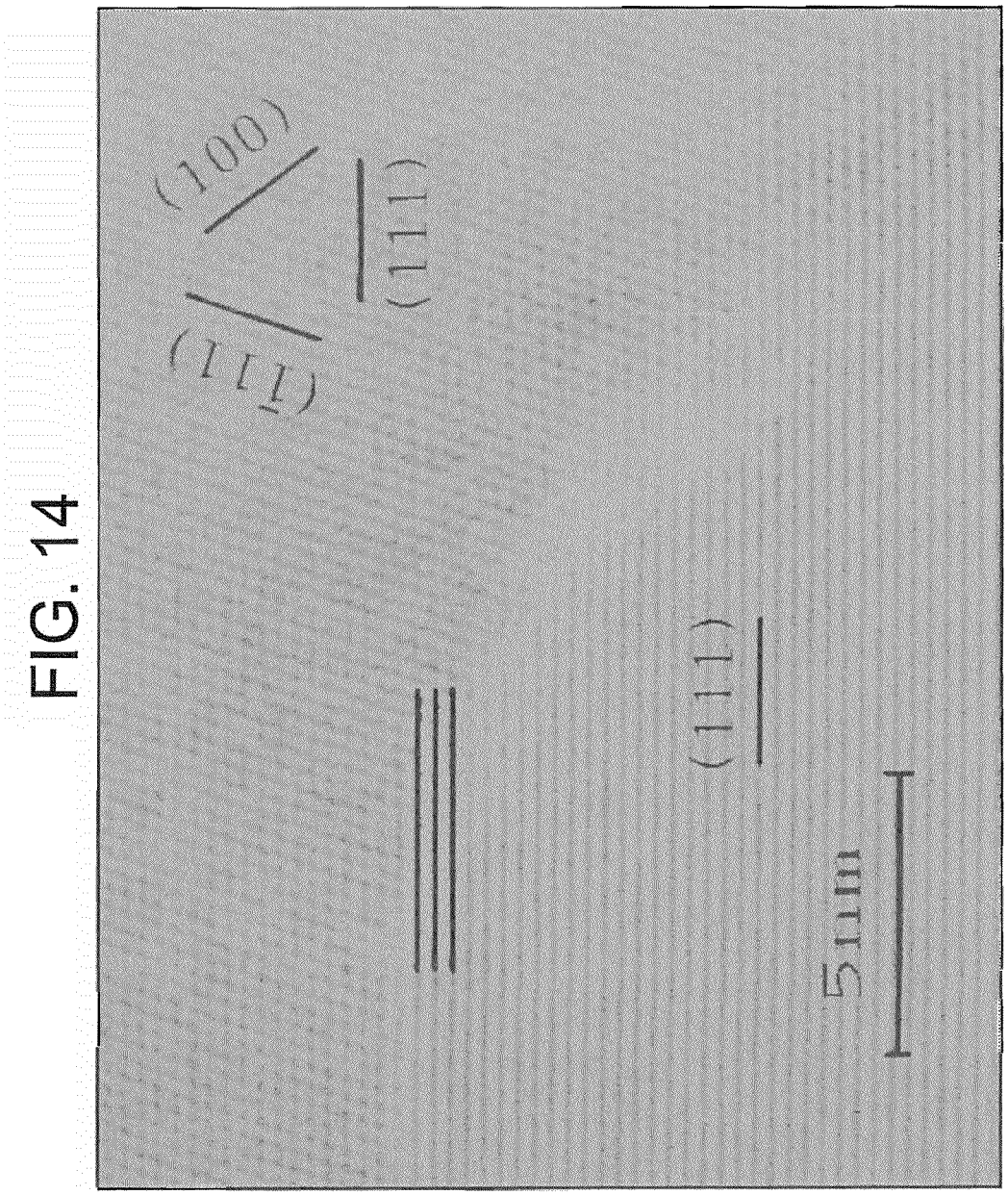
FIG. 14 is a view showing a TEM photograph of CGS.

The present inventors observed the crystal grain boundaries of the semiconductor thin film obtained through the foregoing manufacturing method in detail by an HR-TEM Resolution Transmission Electron Microscope) (FIG. 14). In the present specification, the crystal grain boundary is defined as a grain boundary formed at an interface where different rod-like crystals are in contact with each other, unless specified otherwise. Thus, the crystal grin boundary is regarded as different from, for example, a macroscopic grain boundary formed by collision of separate lateral growth regions.

The foregoing HR-TEM (High Resolution Transmission Electron Microscope) is a method in which a sample is vertically irradiated with an electron beam and the arrangement of atoms and molecules is estimated by using interference of transmission electrons or elastically scattered electrons. By using this method, it is possible to observe the state of arrangement of crystal lattices as lattice stripes. Thus, by observing the crystal grain boundary, it is possible to infer the bonding state of atoms at the crystal grain boundary.

In the TEM photograph (FIG. 14) obtained by the present inventors, the state where two different crystal grains (rod-like crystal grains) are in contact with each other at the crystal grain boundary is clearly observed. At this time, it is ascertained by the electron beam diffraction that the two crystal grains are almost in a $\{110\}$ orientation although some deviations are included in crystal axes.

In the observation of lattice stripes' by the TEM photograph as described above, lattice stripes corresponding to a $\{111\}$ plane are observed in the $\{110\}$ plane. Incidentally, the lattice stripe corresponding to the $\{111\}$ plane indicates such a lattice stripe that when crystal grain is cut along the lattice stripe, the $\{111\}$ plane appears in the section. It is possible to simply ascertain through the distance between the lattice stripes to what plane the lattice stripe corresponds.

At this time, the present inventors observed in detail the TEM photograph of the semiconductor thin film obtained through the foregoing manufacturing method, and as a result, very interesting findings were obtained. In both of the two different crystal grains seen in the photograph, lattice stripes corresponding to the $\{111\}$ plane were seen. And it was observed that the lattice stripes were obviously parallel to each other.

Further, irrespective of the presence of the crystal grain boundary, lattice stripes of the two different crystal grains were connected to each other so as to cross the crystal grain boundary. That is, it was ascertained that almost all lattice stripes observed to cross the crystal grain boundary were linearly continuous in spite of the fact that they were lattice stripes of different crystal grains. This is also the case with any crystal grain boundary.

Such a crystal structure (precisely the structure of crystal grain boundary) indicates that two different crystal grains are in contact with each other with excellent conformity in the crystal grain boundary. That is, crystal lattices are continuously connected to each other in the crystal grain boundary, so that such a structure is formed that trap levels caused by crystal defects or the like are not easily formed. In other words, it can be said that the crystal lattices are continuous in the crystal grain boundary.

Figure 15:
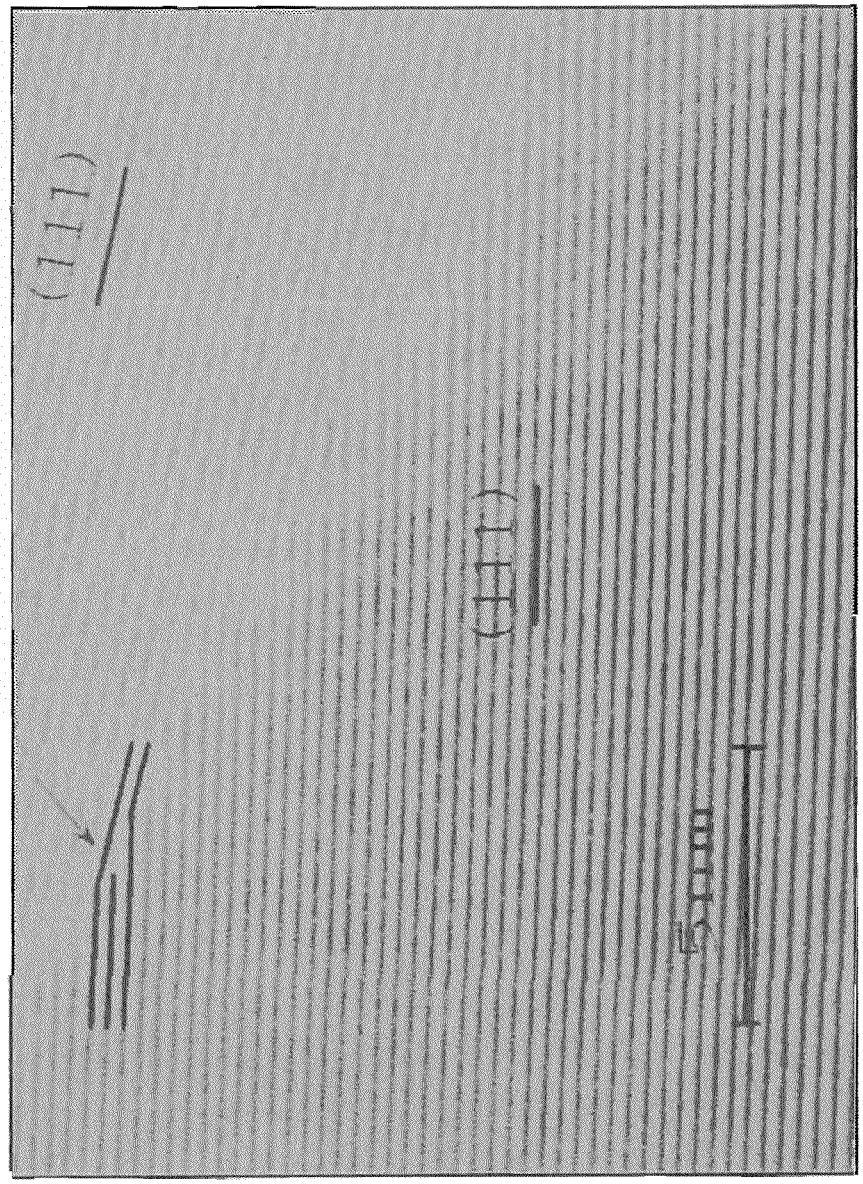
FIG. 15 is a view showing a TEM photograph of a conventional high temperature polysilicon.

In FIG. 15, for reference, analysis by the electron beam diffraction and HR-TEM observation was carried out by the present inventors for a conventional polycrystalline silicon film (so-called high temperature polysilicon film) as well. As a result, it was found that lattice stripes were random in the two different crystal grains and there hardly existed connection continuous in the crystal grain boundary with excellent conformity. That is, it was found that there were many portions where the lattice stripes were cut in the crystal grain boundary, and there were many crystal defects.

The present inventors refer to the bonding state of atoms in the case where the lattice stripes correspond to each other with good conformity, like the semiconductor thin film produced by the method of the present embodiment, as "paired bond," and refer to a bond at that time as a "paired bond." On the contrary, the present inventors refer to the bonding state of atoms in the case where the lattice stripes do not correspond to each other with good conformity, often seen in a conventional polycrystalline silicon film, as "unpaired bond," and refer to a bond at that time as an "unpaired bond" (or an "dangling bond").

Since the semiconductor thin film used in the present embodiment is extremely excellent in conformity at the crystal grain boundary, the foregoing unconformity bonds are very few. As a result of study for arbitrary plural crystal grain boundaries conducted by the present inventors, the existing ratio of the unconformity bonds to the total bonds was 10% or less (preferably 5% or less, more preferably 3% or less). That is, 90% or more of the total bonds (preferably 95% or more, more preferably 97% or more) are constituted by the conformity bonds.

Figure 16A:
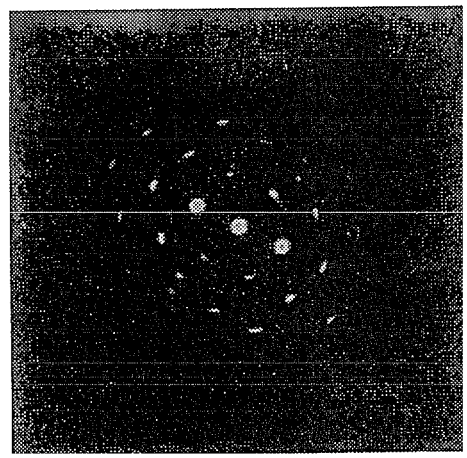
FIGS. 16A and 16B are views showing electron beam diffraction patterns of CGS and conventional high temperature polysilicon.
Figure 16B:

FIG. 16A shows a result of observation by the electron beam diffraction for a lateral growth region formed in accordance with the foregoing steps. FIG. 16B shows an electron beam diffraction pattern of a conventional polysilicon film (called "high temperature polysilicon film") observed for comparison.

In the electron beam diffraction patterns shown in FIGS. 16A and 16B, the diameter of an irradiation area of an electron beam is 4.25 µm, and the information of a sufficiently wide region is collected. The photographs shown here show typical diffraction patterns as a result of investigation for arbitrary plural portions.

In the case of FIG. 16A, diffraction spots (diffraction flecks) corresponding to the <110> incidence appear comparatively clearly, and it can be ascertained that almost all crystal grains in the irradiation area of the electron beam are in the {110} orientation. On the other hand, in the case of the conventional high temperature polysilicon film shown in FIG. 16B, clear regularity can not be seen in the diffraction spots, and it is found that grain boundaries with plane orientation other than the {110} plane are irregularly mixed.

Like this, the feature of the semiconductor thin film used in the present invention is that this film shows the electron beam diffraction pattern having regularity peculiar to the {110} orientation, although this film is a semiconductor thin film having crystal grain boundaries. When electron beam diffraction patterns are compared, the difference from the conventional semiconductor thin film is clear.

As described above, the semiconductor thin film manufactured through the foregoing manufacturing steps is a semiconductor thin film having a crystal structure (precisely a structure of a crystal grain boundary) quite different from the conventional semiconductor thin film. The present inventors have explained the result of analysis as to the semiconductor thin film used in this embodiment in Japanese Patent Application Nos. Hei 9-55633 filed on Feb. 24, 1997, Hei 9-165216 filed on Jun. 6, 1997 and Hei 9-212428 filed on Jul. 23, 1997 as well. The entire disclosures of the three Japanese Patent Applications including specification, claims, drawings and summary, respectively are incorporated herein by references in their entirety.

Since 90% or more of the crystal grain boundaries of the semiconductor thin film used in the present invention as described above are constituted by conformity bonds, they hardly have a function as a barrier against movement of carriers. That is, it can be said that the semiconductor thin film used in this embodiment has substantially no crystal grain boundary.

In the conventional semiconductor thin film, although the crystal grain boundary serves as a barrier for blocking the movement of carriers, since such a crystal grain boundary does not substantially exist in the semiconductor thin film used in the present invention, a high carrier mobility can be realized. Thus, the electrical characteristics of a TFT manufactured by using the semiconductor thin film used in this embodiment show very excellent values. This will be described below.

[Findings as to Electrical Characteristics of a TFT]

Since the semiconductor thin film used in this embodiment can be regarded substantially as single crystal (crystal grain boundaries do not exist substantially), a TFT using the semiconductor thin film as an active layer shows electrical characteristics comparable with a MOSFET using single crystal silicon. Data as shown below have been obtained from TFTs experimentally formed by the present inventors.

(1) The subthreshold coefficient as an index showing switching performance (promptness in switching of on/off operation) of a TFT is as small as 60 to 100 mV/decade (typically 60 to 85 mV/decade) for both an N-channel TFT and a P-channel TFT.

(2) The field effect mobility ($\mu_{FE}$) as an index showing an operation speed of a TFT is as large as 200 to 650 cm$^2$/Vs (typically 250 to 300 cm$^2$/Vs) for an N-channel TFT, and 100 to 300 cm$^2$/Vs (typically 150 to 200 cm$^2$/Vs) for a P-channel TFT.

(3) The threshold voltage ($V_{th}$) as an index indicating a driving voltage of a TFT is as small as −0.5 to 1.5 V for an N-channel TFT and −1.5 to 0.5 V for a P-channel TFT.

As described above, it has been ascertained that extremely superior switching characteristics and high speed operation characteristics can be realized.

Incidentally, in the formation of CGS, the foregoing annealing step at a temperature (700 to 1100° C.) above crystallizing temperature plays an important role with respect to lowering of defects in the crystal grains. This will be described below.

Figure 17A:
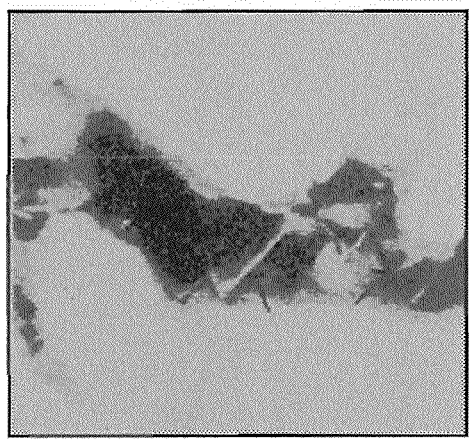
FIGS. 17A and 17B are views showing TEM photographs of CGS and conventional high temperature polysilicon.

FIG. 17A is a TEM photograph of a crystal silicon film when steps up to the foregoing crystallization step have been ended, which is magnified 250 thousand times. Zigzag defects as indicated by an arrow are ascertained in the crystal grains (black portion and white portion appear due to the difference of contrast).

Although such defects are mainly lamination defects in which the order of lamination of atoms on a silicon crystal lattice plane is discrepant, there is also a case of dislocation. It appears that FIG. 17A shows a lamination defect having a defect plane parallel to the {111} plane. This can be ascertained from the fact that the zigzag defects are bent at about 70°.

Figure 17B:
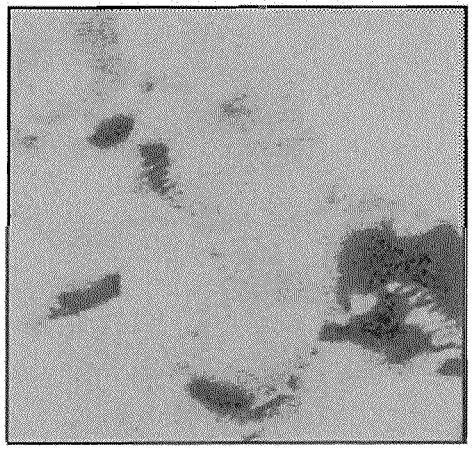

On the other hand, as shown in FIG. 17B, in the crystal silicon film used in the present invention, which is enlarged at the same magnification, it is ascertained that defects caused by lamination defects, dislocations, and the like are hardly seen, and the crystallinity is very high. This tendency can be seen in the entire of the film surface, and although it is difficult to eliminate the defects in the present circumstances, it is possible to decrease the number to substantially zero.

That is, in the crystal silicon film used in this embodiment, defects in the crystal grain are reduced to such an extent that the defects can be almost neglected, and the crystal grain boundary can not become a barrier against movement of carriers because of its high continuity, so that the film can be regarded as single crystal or substantially single crystal.

Like this, in the crystal silicon films shown in the photographs of FIGS. 17A and 17B, although both of the crystal grain boundaries have almost equal continuity, there is a large difference in the number of defects in the crystal grains. The reason why the crystal silicon film shown in FIG. 17B shows electrical characteristics much higher than the crystal silicon film shown in FIG. 17A is mainly the difference in the number of defects.

From the above, it is understood that the gettering process of an element for facilitating crystallization of the amorphous silicon film is an indispensable step in the formation of CGS. The present inventors consider the following model for a phenomenon caused by this step.

First, in the state shown in FIG. 17A, the element for facilitating crystallization of the amorphous silicon film (typically nickel) is segregated at the defects (mainly lamination defects) in the crystal grain. That is, it is conceivable that there are many bonds such as Si—Ni—Si.

However, when Ni existing in the defects is removed by carrying out the gettering process of the element for facilitating crystallization of the amorphous silicon film, the bond of Si—Ni is cut. Thus, the remaining bond of silicon immediately forms Si—Si bond and becomes stable. In this way, the defects disappear.

Of course, although it is known that the defects in the crystal silicon film disappear by thermal annealing at a high temperature, it is presumed that since bonds with nickel are cut and many unpaired bonds are produced, so that recombination of silicon is smoothly carried out.

The present inventors also consider a model in which the crystal silicon film is bonded to its under layer by a heat treatment at a temperature (700 to 1100° C.) above the crystallizing temperature and adhesiveness is increased, so that the defects disappear.

The thus obtained crystal silicon film (FIG. 17B) has the feature that the number of defects in the crystal grains is extremely smaller than the crystal silicon film (FIG. 17A) in which merely crystallization has been carried out. The difference in the number of defects appears as the difference in spin density by the analysis of Electron Spin Resonance (ESR). In the present circumstances, the spin density of the crystal silicon film used in the present invention is at most $1 \times 10^{18}$ spins/cm$^3$ (typically, $5 \times 10^{17}$ spins/cm$^3$ or less).

The crystal silicon film having the above described crystal structure and the features and used in the present invention is referred to as "Continuous Grain Silicon: CGS."

[Embodiment 2]

In the foregoing embodiment 1, description has been made on the case where the digital driving system driving circuit of the present invention is used for the active matrix type liquid crystal display device. In this case, as a display method used for the active matrix type liquid crystal display device, a TN mode using a nematic liquid crystal, a mode using electric field control birefringence, a mixed layer of a liquid crystal and a high polymer, a so-called polymer dispersion mode, and the like can also be used.

Further, in the digital driving system driving circuit of the present invention, the line-sequential scanning of the pixel TFTs is carried out as described above, and the number of pixels corresponds to the future ATV (Advanced TV). Thus, if the driving circuit is used for an active matrix type liquid crystal display device which uses a liquid crystal with a high response speed, that is, a so-called non-threshold antiferroelectric liquid crystal, more excellent characteristics can be shown.

The driving circuit of the present invention can also be used for a liquid crystal display device using a ferroelectric liquid crystal which is being realized by recent researches and in which the orientation of the ferroelectric liquid crystal is controlled with a specific oriented film and gradation display can be made like a TN liquid crystal mode.

The driving circuit of the present invention shown in the embodiment 1 or 2 may be used as a driving circuit of a display device including any other display medium in which its optical characteristics can be modulated in response to an applied voltage. For example, the driving circuit may be used as a driving circuit of a display device using an electroluminescence element or the like.

The driving circuit of the present invention typically shown in the embodiment 1 or 2 may be used as a driving circuit of a semiconductor device such as an image sensor. In this case, the driving circuit can also be applied to such an image sensor that a light receiving portion of the image sensor and a picture display portion for displaying a picture converted into electric signals at the light receiving portion are integrally formed. The image sensor to which the present invention is applied may be a line sensor or an area sensor.

[Embodiment 3]

In the embodiments 1 and 2, although a transmission type active matrix liquid crystal display device has been described, it is needless to say that the driving circuit of the present invention can also be used for a reflection type active matrix liquid crystal display device.

[Embodiment 4]

The driving circuit of the embodiment 1, and the active matrix type semiconductor display device (embodiments 2 and 3) using the driving circuit have various applications. In this embodiment, semiconductor devices each including such a semiconductor display device will be described.

As such semiconductor devices, a video camera, a still camera, a projector, a head mount display, a car navigation system, a personal computer, a portable information terminal (mobile computer, portable phone, etc.) and the like are enumerated. Examples of those will be shown in FIGS. 18A to 18F.

Figure 18A:
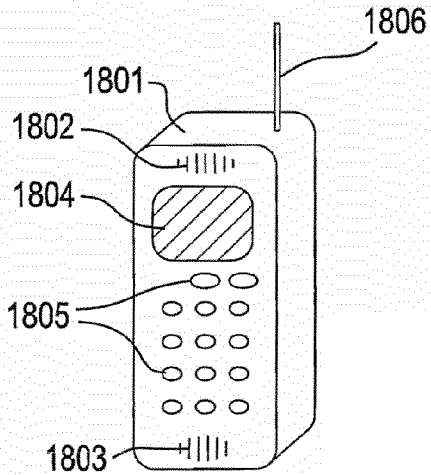
FIGS. 18A-18F are views showing semiconductor devices each including a semiconductor display device having a driving circuit of the present invention.

FIG. 18A shows a portable telephone which is constituted by a main body 1801, an audio output portion 1802, an audio input portion 1803, a semiconductor display device 1804, an operation switch 1805, and an antenna 1806.

Figure 18B:
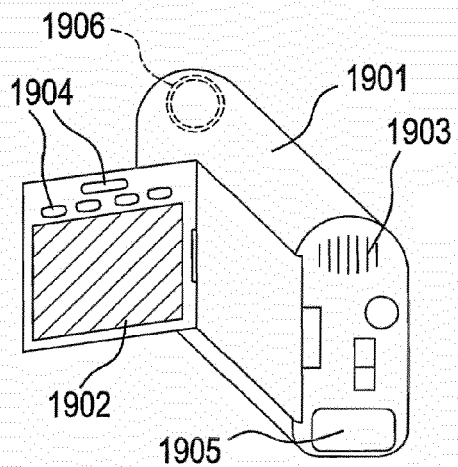

FIG. 18B shows a video camera which is constituted by a main body 1901, a semiconductor display device 1902, an audio input portion 1903, an operation switch 1904, a battery 1905, and an image receiving portion 1906.

Figure 18C:
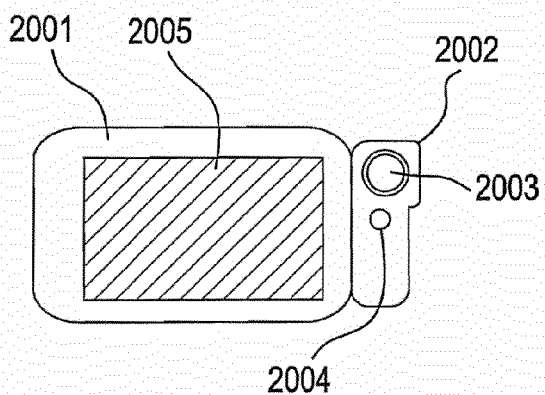

FIG. 18C shows a mobile computer which is constituted by a main body 2001, a camera portion 2002, an image receiving portion 2003, an operation switch 2004, and a semiconductor display device 2005.

Figure 18D:
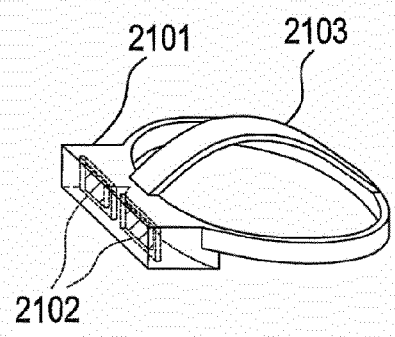

FIG. 18D shows a head mount display which is constituted by a main body 2101, a semiconductor display device 2102, and a band portion 2103.

Figure 18E:
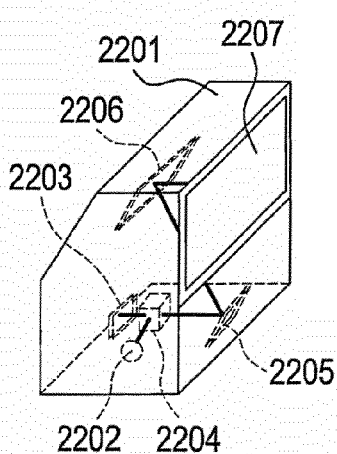

FIG. 18E shows a rear type projector which is constituted by a main body 2201, a light source 2202, a semiconductor display device 2203, a polarizing beam splitter 2204, reflectors 2205 and 2206, and a screen 2207. Incidentally, in the rear type projector, it is preferable that an angle of the screen can be changed, while fixing the main body, according to the position where a viewer sees the screen. When three such semiconductor display devices 2203 (each being made to correspond to light of R, G, and B) are used, it is possible to realize a rear type projector with higher resolution/higher fineness.

Figure 18F:
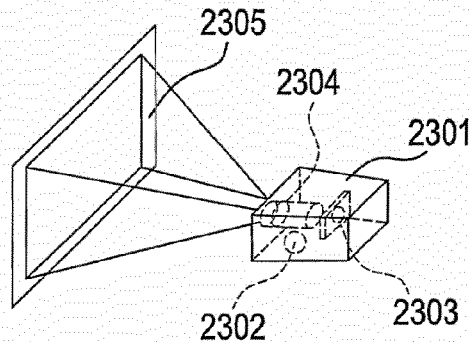

FIG. 18F shows a front type projector which is constituted by a main body 2301, a light source 2302, a semiconductor display device 2303, an optical system 2304, and a screen 2305. When three such semiconductor display devices 2303 (each being made to correspond to light of R, G, and B) are used, it is possible to realize a front type projector with higher resolution/higher fineness.

As described above, according to the present invention, in a driving circuit of a semiconductor display device, the fluctuation of its characteristics can be reduced while securing the current capacity of a buffer circuit. Thus, the semiconductor display device without display blur (display unevenness) and with high fineness/high resolution can be realized.

What is claimed is:

1. A semiconductor device including a display device, comprising:
    a pixel matrix circuit; and
    a first gate signal line side driving circuit and a second gate signal line side driver circuit, wherein the pixel matrix circuit is located between the first gate signal line side driving circuit and the second gate signal line side driver circuit, each of the first gate signal line side driving circuit and the second gate signal line side driver circuit including a shift register circuit and a buffer circuit electrically connected with the shift register circuit, the buffer circuit comprising an inverter,
    wherein the inverter comprises a plurality of n-channel thin film transistors and a plurality of p-channel thin film transistors, and
    wherein each of the plurality of n-channel thin film transistors is connected in parallel with each other and each of the plurality of p-channel thin film transistors is connected in parallel with each other, and
    wherein a channel region of the plurality of n-channel thin film transistors and the plurality of p-channel thin film transistors comprises crystalline silicon.

2. The semiconductor device according to claim 1, wherein the semiconductor device is selected from the group consisting of a video camera, a still camera, a projector, a head mount display, a car navigation system, a personal computer, a portable information terminal, and a portable phone.

3. The semiconductor device according to claim 1, wherein the display device has an electroluminescence element.

4. The semiconductor device according to claim 1, wherein each of the plurality of n-channel thin film transistors and the plurality of p-channel thin film transistors has a plurality of gate electrodes, respectively.

5. The semiconductor device according to claim 1, wherein the plurality of n-channel thin film transistors share a first semiconductor film for a channel region thereof and the plurality of p-channel thin film transistors share a second semiconductor film for a channel region thereof.

6. The semiconductor device according to claim 1, wherein the display device is a liquid crystal display device.

7. A semiconductor device including a display device, comprising:
    a pixel matrix circuit;
    a source signal line side driving circuit electrically connected to the pixel matrix circuit and including a shift register; and
    a gate signal line side driving circuit electrically connected to the pixel matrix circuit,
    wherein the source signal line side driving circuit includes a buffer circuit electrically connected with the shift register, the buffer circuit having a plurality of inverters,
    wherein each of the plurality of inverters comprises a plurality of n-channel thin film transistors and a plurality of p-channel thin film transistors, and
    wherein each of the plurality of n-channel thin film transistors is connected in parallel with each other and each of the plurality of p-channel thin film transistors is connected in parallel with each other, and
    wherein a channel region of the plurality of n-channel thin film transistors and the plurality of p-channel thin film transistors comprises crystalline silicon.

8. A semiconductor device according to claim 7, wherein the semiconductor device is selected from the group consisting of a video camera, a still camera, a projector, a head mount display, a car navigation system, a personal computer, a portable information terminal, and a portable phone.

9. The semiconductor device according to claim 7, wherein the display device has an electroluminescence element.

10. The semiconductor device according to claim 7, wherein each of the plurality of n-channel thin film transistors and the plurality of p-channel thin film transistors has a plurality of gate electrodes.

11. The semiconductor device according to claim 7, wherein the plurality of n-channel thin film transistors share a first semiconductor film for a channel region thereof and the plurality of p-channel thin film transistors share a second semiconductor film for a channel region thereof.

12. The semiconductor device according to claim 7, wherein the display device is a liquid crystal display device.

13. A semiconductor device including a display device, comprising:
    a pixel matrix circuit; and
    a first gate signal line side driving circuit and a second gate signal line side driver circuit, wherein the pixel matrix circuit is located between the first gate signal line side driving circuit and the second gate signal line side driver circuit, each of the first gate signal line side driving circuit and the second gate signal line side driver circuit including a shift register circuit and a buffer circuit electrically connected with the shift register circuit, the buffer circuit comprising a plurality of inverters,
    wherein each of the plurality of inverters comprises a plurality of n-channel thin film transistors and a plurality of p-channel thin film transistors, and
    wherein each of the plurality of n-channel thin film transistors is connected in parallel with each other and each of the plurality of p-channel thin film transistors is connected in parallel with each other, and
    wherein a channel region of the plurality of n-channel thin film transistors and the plurality of p-channel thin film transistors comprises crystalline silicon.

14. The semiconductor device according to claim 13, wherein the semiconductor device is selected from the group consisting of a video camera, a still camera, a projector, a head mount display, a car navigation system, a personal computer, a portable information terminal, and a portable phone.

15. The semiconductor device according to claim 13, wherein the display device has an electroluminescence element.

16. The semiconductor device according to claim 13, wherein each of the plurality of n-channel thin film transistors and the plurality of p-channel thin film transistors has a plurality of gate electrodes, respectively.

17. The semiconductor device according to claim 13, wherein the plurality of n-channel thin film transistors share a first semiconductor film for a channel region thereof and the plurality of p-channel thin film transistors share a second semiconductor film for a channel region thereof.

18. The semiconductor device according to claim 13, wherein the display device is a liquid crystal display device.

19. The semiconductor device according to claim 1, wherein a channel width of the plurality of n-channel thin film transistors and the plurality of p-channel thin film transistors is 100 μm or less.

20. The semiconductor device according to claim 13, wherein a channel width of the plurality of n-channel thin film transistors and the plurality of p-channel thin film transistors is 100 μm or less.

* * * * *

UNITED STATES PATENT AND TRADEMARK OFFICE
CERTIFICATE OF CORRECTION

| | | |
|---|---|---|
| PATENT NO. | : 8,629,823 B2 | Page 1 of 1 |
| APPLICATION NO. | : 13/763895 | |
| DATED | : January 14, 2014 | |
| INVENTOR(S) | : Jun Koyama et al. | |

It is certified that error appears in the above-identified patent and that said Letters Patent is hereby corrected as shown below:

In the Specification

At column 1, line 60, "Thus;" should be --Thus,--;

At column 6, line 61, "charging" should be --changing--;

At column 8, line 47, "is wiring" should be --wiring--;

At column 12, line 56, "using. P" should be --using P--;

At column 16, line 9, "Resolution" should be --(High Resolution--;

At column 16, line 32, "stripes' by" should be --stripes by--.

Signed and Sealed this
Seventh Day of October, 2014

Michelle K. Lee
*Deputy Director of the United States Patent and Trademark Office*